(12) United States Patent
Burgener, II et al.

(10) Patent No.: US 8,736,151 B2
(45) Date of Patent: May 27, 2014

(54) ELECTRIC GENERATOR

(75) Inventors: Robert H. Burgener, II, Murray, UT (US); Gary M. Renlund, Salt Lake City, UT (US)

(73) Assignee: Velos Industries, LLC, Cheyenne, WY (US)

( * ) Notice: Subject to any disclaimer, the term of this patent is extended or adjusted under 35 U.S.C. 154(b) by 621 days.

(21) Appl. No.: 11/860,444

(22) Filed: Sep. 24, 2007

(65) Prior Publication Data

US 2008/0246366 A1 Oct. 9, 2008

Related U.S. Application Data

(60) Provisional application No. 60/826,968, filed on Sep. 26, 2006.

(51) Int. Cl.
*H01L 41/187* (2006.01)
*H01L 41/047* (2006.01)
*H02N 11/00* (2006.01)

(52) U.S. Cl.
USPC .................. 310/358; 310/363; 310/300

(58) Field of Classification Search
USPC .................. 310/300, 357–359; 136/254
See application file for complete search history.

(56) References Cited

U.S. PATENT DOCUMENTS

| | | | | |
|---|---|---|---|---|
| 2,598,707 A | * | 6/1952 | Matthias | 310/358 |
| 2,695,396 A | * | 11/1954 | Anderson | 365/145 |
| 2,791,759 A | * | 5/1957 | Brown | 365/145 |
| 2,893,107 A | * | 7/1959 | Anderson et al. | 29/25.35 |
| 2,926,336 A | * | 2/1960 | Chynoweth | 365/145 |
| 3,126,492 A | * | 3/1964 | Swoboda | 310/306 |
| 3,219,850 A | * | 11/1965 | Langevin | 310/333 |
| 3,243,687 A | * | 3/1966 | Hoh | 322/2 R |
| 3,448,348 A | * | 6/1969 | Stadler | 361/434 |
| 3,521,149 A | | 7/1970 | Roesel, Jr. | |
| 3,569,822 A | * | 3/1971 | Neilson et al. | 323/233 |
| 3,740,118 A | * | 6/1973 | Land et al. | 359/254 |
| 3,769,096 A | * | 10/1973 | Ashkin et al. | 136/213 |
| 3,855,004 A | * | 12/1974 | Brody | 136/254 |
| 4,051,465 A | * | 9/1977 | Brody | 365/117 |

(Continued)

FOREIGN PATENT DOCUMENTS

| | | |
|---|---|---|
| AU | 2007300147 | 3/2011 |
| CN | 200780043724.2 | 10/2010 |

(Continued)

OTHER PUBLICATIONS

Ruan RR, Chen PL. "Principles of Magnetic Resonance," Water in Foods and Biological Materials: A Nuclear Magnetic Resonance Approach, New York: CRCP LLC, pp. 29-32, 1997.

(Continued)

*Primary Examiner* — Thomas Dougherty
(74) *Attorney, Agent, or Firm* — Workman Nydegger

(57) ABSTRACT

Methods, compositions, and apparatus for generating electricity are provided. Electricity is generated through the mechanisms nuclear magnetic spin and remnant polarization electric generation. The apparatus may include a material with high nuclear magnetic spin or high remnant polarization coupled with a poled ferroelectric material. The apparatus may also include a pair of electrical contacts disposed on opposite sides of the poled ferroelectric material and the high nuclear magnetic spin or high remnant polarization material. Further, a magnetic field may be applied to the high nuclear magnetic spin material.

8 Claims, 11 Drawing Sheets

(56) References Cited

U.S. PATENT DOCUMENTS

| | | | | |
|---|---|---|---|---|
| 4,236,938 | A * | 12/1980 | Brody | 136/254 |
| 5,629,549 | A * | 5/1997 | Johnson | 257/421 |
| 5,766,340 | A * | 6/1998 | Geosling | 117/2 |
| 5,986,301 | A * | 11/1999 | Fukushima et al. | 257/306 |
| 6,356,008 | B1 * | 3/2002 | Nakajima | 310/359 |
| 6,469,334 | B2 * | 10/2002 | Arita et al. | 257/295 |
| 6,555,293 | B1 * | 4/2003 | Fejer et al. | 430/311 |
| 6,586,305 | B2 * | 7/2003 | Graf | 438/275 |
| 6,597,492 | B1 * | 7/2003 | Rosenman et al. | 359/326 |
| 6,982,514 | B1 * | 1/2006 | Lu et al. | 310/300 |
| 6,995,496 | B1 * | 2/2006 | Hagood et al. | 310/317 |
| 7,109,409 | B2 * | 9/2006 | Chu | 136/254 |
| 7,388,321 | B2 * | 6/2008 | Hattori et al. | 310/311 |
| 7,511,402 | B2 * | 3/2009 | Ito et al. | 310/300 |
| 7,517,702 | B2 * | 4/2009 | Halilov et al. | 438/3 |
| 7,521,842 | B2 * | 4/2009 | Tucker et al. | 310/339 |
| 7,611,913 | B2 * | 11/2009 | Li et al. | 438/3 |
| 8,043,987 | B2 * | 10/2011 | Chen et al. | 501/136 |
| 2004/0159903 | A1 | 8/2004 | Burgener, II et al. | |
| 2004/0218157 | A1 | 11/2004 | Bakker et al. | |
| 2007/0063238 | A1 * | 3/2007 | Kaibara et al. | 257/295 |
| 2008/0251735 | A1 * | 10/2008 | Putterman et al. | 250/424 |
| 2009/0218908 | A1 * | 9/2009 | Palffy-Muhoray et al. | 310/300 |
| 2013/0037092 | A1 * | 2/2013 | Cheong et al. | 136/254 |
| 2013/0093290 | A1 * | 4/2013 | Fox et al. | 310/357 |

FOREIGN PATENT DOCUMENTS

| | | | | |
|---|---|---|---|---|
| CN | 200780043724.2 | | 6/2011 | |
| FR | 2680613 | * | 8/1991 | G21N 7/00 |
| JP | 61-503000 | | 12/1986 | |
| JP | 01-502954 | | 10/1989 | |
| JP | 5-347422 A | * | 12/1993 | G11C 13/00 |
| JP | 09-275688 | | 10/1997 | |
| JP | 2002-111089 | | 4/2002 | |
| JP | 2003-224315 | | 8/2003 | |
| JP | 2004-127744 | | 4/2004 | |
| JP | 2004-168637 | | 6/2004 | |
| JP | 2006-128444 | | 5/2006 | |
| JP | 2009-530559 | | 10/2012 | |
| WO | 8300963 | * | 3/1983 | H02K 53/00 |
| WO | WO-2006-060191 | * | 6/2006 | |
| WO | 2008/039780 | | 4/2008 | |

OTHER PUBLICATIONS

Eisberg, Robert M., and Robert E. Resnick, "Magnetic Dipole Moments, Spin, and Transition Rates," Quantum Physics of Atoms, Molecules, Solids, Nuclei, and Particles, New York, Wiley, pp. 266-278, 1985.

Whiffen, D.H. "Nucelar Magnetic Resonance," Spectroscopy, 1st ed. London and Southhampton, The Camelot Press Ltd., pp. 22-51 1966.

* cited by examiner

ELECTRIC GENERATOR

RELATED APPLICATIONS

This application claims the benefit of U.S. Provisional Application No. 60/826,968, filed Sep. 26, 2006, entitled GENERATING ELECTRICITY FROM NUCLEAR MAGNETIC SPIN, which is incorporated herein by reference.

BACKGROUND OF THE INVENTION

This application relates to methods, apparatus, and compositions for the generation of electricity. In particular, it relates to method, apparatus, and compositions which employ the mechanisms of nuclear magnetic spin generation (NMSG) and/or remnant polarization electric generation (RPEG) to produce electricity.

Readily available and portable supplies of electric power are critical to almost every aspect of modern life. Electric power drives a wide assortment of devices that have become key to functioning in modern society. These devices range from electric lights and appliances in the home, to highly technical devices used in fields such as medicine, manufacturing, military, and scientific research.

In many applications it is critical to have portable sources of electricity. These needs are conventionally met by the use of batteries of various types. Batteries are, of course, used to start automobiles and trucks, and are also used to power electrical devices that must be moved. These devices range from flashlights to cellular telephones and laptop computers.

Electrical power has both large and very small applications. On the large scale, electricity is generated by large scale electric generators and distributed over distribution lines to ultimate users. At the small scale, small electrical charges are involved in operating electronic circuits and memory devices that are ubiquitous in modern life. Each of these devices and systems requires a reliable and controlled source of electricity.

One of the major technical problems involving portable electronic devices is the providing of reliable and consistent sources of portable power. As mentioned above, this is generally accomplished by the use of batteries. However, batteries are problematic. Battery power has always been a major issue in the use of devices such as laptop computers. Battery life is a concern, as is the reliability of battery power.

A further problem encountered with battery power is providing a sufficient supply of batteries to remote locations. This can be appreciated by consideration of, as an example, military operations. Military operations require a huge array of electronic devices. These devices range from laptop computers and related devices to cellular telephones and other communications systems. They also, of course, involve military equipment and weaponry which employ electronic components. Operations of this nature rely heavily on such portable electronic devices. In order to power such devices, batteries must be provided and constantly replaced in order to make sure that all equipment is constantly functional. It will be appreciated that it is a major logistic problem to simply provide adequate battery power to a major military operation. Large quantities of batteries must constantly be supplied and removed from sources of supply to the field.

The same is true other types of operations in the fields of business, medicine, and research. As mentioned above, all of these fields rely heavily on portable electronic devices. All of those devices require a portable source of electric power. Providing that power has been a major challenge.

Thus, the present invention relates to new methods, apparatus, and compositions for generating electric power and, if desired, providing that power in a portable format. This is accomplished through the use of nuclear magnetic spin (NMSG) and remnant polarization electric generation (RPEG), which will be discussed briefly below.

It is known that any nucleus with a non-zero spin quantum number, placed in a magnetic field can absorb and emit energy through electromagnetic radiation. This radiation can be detected by using the principles of nuclear magnetic resonance. Use with a hydrogen nucleus, or proton, is the earliest and most common NMR method; principally used to investigate organic compounds. A nucleus of hydrogen, with a spin of $I=\frac{1}{2}$, spins around its axis and generates a magnetic field. When this nucleus is placed in an external magnetic field, the hydrogen nucleus tends to align with the external magnetic field. The alignment can be parallel or anti-parallel with the external field, because the spinning can be thought of as the spinning of a toy top that spins slightly off axis and is known by the term precession. The frequency of precession is termed the Larmor frequency ($\omega$). The Larmor frequency is dependent on the strength of the external magnetic field and the magnetic properties of the material. In this case, a hydrogen nucleus has a Larmor frequency of 42.6 MHz per external magnetic field strength of 1 tesla. A radio frequency tuned to the magnetic field strength can cause the nucleus to flip from an anti-parallel state to a parallel state, thus releasing a small amount of energy that can be detected. The radio frequency varies with the environment surrounding the hydrogen nucleus, thereby giving information about the chemical surroundings of the hydrogen nucleus.

As described above, a hydrogen nucleus has a spin $I=\frac{1}{2}$. Other elements have larger spins than $\frac{1}{2}$. Further, atomic nuclei are known to possess a positive charge, Ze, where Z is the atomic number, which distinguishes one element from another, and where e is the magnitude of charge of an electron or proton. Elements also have mass, M, which can vary from one isotope to another. Nuclei may also possess spin, a magnetic dipole moment, $\mu$, an electrical quadruple moment and occasionally higher moments. Intrinsic nuclear angular momenta are quantized and may be expressed as $I\hbar$ where I is an integer or half-integer and is called the spin quantum number. For example, a nucleus for which $I=3/2$ is said to have a spin of 3/2. I may be different for different isotopes. There is a restriction on the spin that nuclei can possess. For nuclei with an even mass number, I must be an integer or zero whereas nuclei with an odd mass number, I must be a half-integer. Table 1, below, shows some common nuclear properties including spins for selected isotopes.

TABLE 1

Spin Properties of Selected Isotopes
Some Nuclear Properties

| Nucleus | Spin I | Magnetic Moment in Nuclear Magnetons | Resonance Frequency in KHz per Oersted Field | Quadrupole Moment, Q. Units $10^{-24}$ cm$^2$ |
|---|---|---|---|---|
| H | 1/2 | 2.79 | 4.26 | — |
| D | 1 | 0.86 | 0.65 | 0.0028 |
| $^4$He | 0 | — | — | — |
| $^{12}$C | 0 | — | — | — |
| $^{13}$C | 1/2 | 0.70 | 1.07 | — |
| $^{14}$N | 1 | 0.40 | 0.31 | 0.02 |
| $^{16}$O | 0 | — | — | — |
| $^{19}$F | 1/2 | 2.63 | 4.01 | — |
| $^{23}$Na | 3/2 | 2.22 | 1.13 | 0.1 |

TABLE 1-continued

Spin Properties of Selected Isotopes
Some Nuclear Properties

| Nucleus | Spin I | Magnetic Moment in Nuclear Magnetons | Resonance Frequency in KHz per Oersted Field | Quadrupole Moment, Q. Units $10^{-24}$ cm$^2$ |
|---|---|---|---|---|
| $^{31}$P | 1/2 | 1.13 | 1.72 | — |
| $^{32}$S | 0 | — | — | — |
| $^{35}$Cl | 3/2 | 0.82 | 0.42 | −0.08 |
| $^{37}$Cl | 3/2 | 0.68 | 0.35 | −0.06 |
| $^{39}$K | 3/2 | 0.39 | 0.20 | 0.07 |
| $^{79}$Br | 3/2 | 2.10 | 1.07 | 0.33 |
| $^{81}$Br | 3/2 | 2.26 | 1.15 | 0.28 |
| $^{127}$I | 5/2 | 2.79 | 0.85 | −0.75 |

If a nucleus has a spin of zero, then all of its moments are zero and no nuclear orientational effects arise. If the spin is ½ or greater then the nucleus possesses a magnetic moment, $\mu$. In this property, the nucleus resembles any rotating charge. The nucleus may be thought of as having a little magnet whose direction is fixed parallel to the spin axis. A negative moment means that the magnetic moment vector is opposite to the spin vector. The unit of measure to express nuclear moments is the nuclear magneton, which is $e\hbar/2\pi Mc$. In this case, M is the mass of a proton. One nuclear magneton=5× $10^{-24}$ erg/Gauss. A nucleus with a spin of 1 or greater possesses an electrical quadrupole moment. The angular momentum vector of a nucleus can have 2 I+1 directions in space. These directions in space are often characterized by a resolved angular momentum along a specified direction. The resolved momentum is given by $M_I$ and have the values of I, I−1, I−2, . . . −I+1, −I. For the common case of I=½ $M_I$=+½ or −½, transitions are allowed but the energy difference is so small that it is effectively not observed. But, in a magnetic field, there is an additional energy that must be considered. This is analogous to the energy required to move a compass needle away from the direction it is pointing. The energy is −$\mu$H cos θ, where H is the magnitude of the magnetic field. The energy of the magnetic field set the upper limit of electrical energy that can be extracted from the generator proposed in this disclosure.

There is a frequency associated with the transition between $M_I$=−½ to +½. That frequency is given by h$\nu$=−($\mu$/I)H(−½−½). This frequency is related to the energy required to "flip" the spin from (+) to (−) or in more correct terms, the orientational potential energy when the dipole is parallel to the field is the (−) term and it is the (+) when the dipole is antiparallel to the field. The energy is always 2× the magnitude of the dipole spin. An example of this calculation is given below. This equation may be written in terms of the magnetogyric ratio, $\gamma$, where $\gamma=\mu/I\hbar$ or $\omega=2\pi\mu=\gamma H$ radians/second. Table 1 has a column showing the Resonance Frequency (Larmor Frequency) for transitions in a magnetic field of 1 Oersted.

Ferroelectricity is an electrical phenomenon whereby certain materials may exhibit a spontaneous dipole moment the direction of which can be switched between equivalent states by the application of an external electric field. The internal electric dipoles of a ferroelectric material are physically tied to the material lattice so anything that changes the physical lattice will change the strength of the dipoles and cause a charge to flow into or out of the ferroelectric material (see discussion below) even without the presence of an external voltage across the capacitor. Two stimuli that will change the lattice dimensions of a material are force and temperature. The generation of a charge in response to the application of a force to a ferroelectric material is called piezoelectricity. The generation of current in response to a change in temperature is called pyroelectricity.

The term ferroelectricity is used in analogy to ferromagnetism, in which a material exhibits a permanent magnetic moment. Ferromagnetism was already known when ferroelectricity was discovered. Thus, the prefix "ferro", meaning iron, was used to describe the property despite that fact that most ferroelectric materials do not have iron in their lattice. For some ferroelectrics iron acts as a contaminant limiting ferroelectric properties.

Placing a ferroelectric material between two conductive plates creates a ferroelectric capacitor. Ferroelectric capacitors exhibit nonlinear properties and usually have very high dielectric constants. The fact that the internal electric dipoles can be forced to change their direction by the application of an external voltage gives rise to hysteresis, in the "polarization vs. voltage" property of the capacitor. See FIG. 7 for an example of the general shape of the hysteresis loop. In this case, polarization is defined as the total charge stored on the plates of the capacitor divided by the area of the plates. Independent of crystal structure, domains similar to those seen in ferromagnetic domains are also seen in ferroelectrics. Within a given domain there is a vector pointing in the direction of the dipoles. In a given bulk material containing many single crystal grains there may be a ferroelectric domain and a domain wall separating orientational vectors from each other. In poled ferroelectrics most of the domain vectors line up in the direction imposed by the external electric field.

One application for this hysteresis and ferroelectric capacitance is for memory in computer applications. Other applications use the combined properties of memory, piezoelectricity, and pyroelectricity to make some of the most useful technological devices in modern society. Ferroelectric capacitors are used in medical ultrasound machines (the capacitors generate and then listen for the ultrasound "ping" used to image the internal organs of a body), high quality infrared cameras (the infrared image is projected onto a two dimensional array of ferroelectric capacitors capable of detecting temperature differences as small as millionths of a degree Celsius), fire sensors, sonar, vibration sensors, and even fuel injectors on diesel engines. Engineers use the high dielectric constants of ferroelectric materials to concentrate large values of electrical charge into small volumes, resulting in the very small surface mount capacitors. Without the space savings allowed by surface mount capacitors, compact laptop computers and cell phones simply would not be possible. The electro-optic modulators that form the backbone of the Internet are made with ferroelectric materials.

It is apparent that a need exists in the art for the production of electricity more effectively and efficiently. There is a particular need for the production of electricity in a manner that can power portable electrical devices. The methods, apparatus, and compositions disclosed below provide for the production of electricity and the production of such electricity in a portable fashion, if desired.

BRIEF SUMMARY OF THE INVENTION

The present invention relates to methods, apparatus, and compositions for the generation of electricity employing phenomena such as nuclear magnetic spin (NMSG) and remnant polarization electric generation (RPEG). Generators of this nature are observed to repeatedly and reliably charge and to provide a consistent output of electricity. Such generators may be employed on a large scale to generate large quantities of electrical power for distribution through an electric distribution network. They may also be used on a very small scale, such as power sources for portable electrical devices such as laptop computers and cellular telephones. Such generators could also be used on an even smaller scale to power individual circuit components within an electrical circuit. Thus, it will be appreciated that the generators disclosed herein may be scaled to the desired application.

It will be appreciated that an electron in motion, within a magnetic field, is an electrical generator. This is a conventional definition for an electrical generator. The present invention provides for apparatus, compositions, and methods for generating electricity from two alternate sources.

As mentioned above, the first employs nuclear magnetic spin (NMSG), a natural property of many elements, to generate electricity. If NMS results in a large spin angular momentum, then electrons, in outer orbitals, are induced to move in an oscillating motion due to positive coulomb forces emanating from the nucleus. The electric generator, within the scope of the present invention, spontaneously and continuously produces an electrical charge from the NMS of the element.

The second means of generating electrical energy is quite similar to the first method, but uses the outer electrons bound in ferroelectric crystals, such as lead zirconium titanate, known previously to produce electricity by the piezoelectric effect. In the situation described below, this material spontaneously and continuously produces voltage and small amounts of current.

Both embodiments of this invention are principally interface or area devices. This means that the electricity can be more efficiently produced in thin layers with large areas.

The first method uses the nuclear magnetic spin properties discussed above has been used successfully for many decades in the area of spectroscopy and imaging. Nuclear magnetic resonance (NMR) is a spectrographic technique used initially to determine the structure of organic molecules using the spin of the hydrogen nucleus. Later this technique was used to determine the structure or special orientation of inorganic materials, such as amorphous and crystalline solids, using the spin of the isotopes of oxygen and silicon, $O^{17}$, $^{19}F$, $^{23}N$, $^{31}P$, and $Si^{29}$. Later the NMR spectroscopy techniques were extended to the area of imaging, as in the now familiar magnetic resonance imaging, MRI.

In one embodiment, an electric generator using NMS employs the combination of two materials in contact with each other. While the first material could potentially be a wide variety of elements, it is generally desirable for the material to have the following properties: a) a high nuclear magnetic spin, or large dipole moment; b) a large electrical quadrupole moment, which means that there is a large non-spherical shape to the nucleus; c) a high degree of natural abundance; d) for commercial applications, the isotope should not be radioactive, but for space-based or military applications the restrictions on radioactivity might be relaxed; e) a natural frequency or Larmor frequency that describes the rate of precession associated with the isotope; f) the combination of the dipole moment, quadrupole moment, and Larmor frequency causes a coulombic interaction with outer electrons of the isotope. These outer electrons will move in response to the non-spherical shape of the nucleus. The larger the movement of these outer electrons the larger will be the electrical impact on the second material, a ferroelectric.

The second material will respond to the frequency of motion of the nuclear magnetic material, much like a piezoelectric material will respond to the mechanical motion that imparts an electrical charge. Generally, these materials will possess a high dielectric constant for the storage of charge. High piezoelectric constants are desired for this material selection.

The magnetic field is required for the nuclear magnetic material to precess at the Larmor frequency. The frequency of precession is tied to the strength of the magnetic field.

The combination of a nuclear magnetic material and a ferroelectric, both in a magnetic field require that this type of device be enlarged by the area of contact of the two materials. The larger the area of contact between the two materials, the more power can be generated at the interface of the device.

A device can also be provided which is believed to operate on the principles of RPEG. The efficiency of remnant ferroelectric generator can be summarized as follows. A poled ferroelectric crystal may be obtained by first heating the material above the $T_c$. Then applying a sufficiently large (greater than the coercive force) external electric field and cooling the ferroelectric material below $T_c$. When the electric field is removed and the material is cooled to room temperature the maximum polarization is realized. Over time the polarization may or may not decay depending on the stability of the material. This resulting polarization is termed "remnant polarization." See FIG. 8 for a diagram of remnant polarization.

In some cases the remnant polarization may remain the same as the spontaneous polarization. For the maximum output of the remnant polarization generator, it is desirable to use a material that has a high, stable, predictable remnant polarization. This is accomplished by retaining stable ferroelectric domains in between electrodes. In this case the thickness of each layer may be a significant variable. This is due to the alignment of ferroelectric domain vectors that may be more efficiently distributed in 3-dimensions rather than the interactions that occur at the interface in the nuclear magnetic spin generator.

One significant difference between the RPEG and ferroelectric memory is the necessary switching of the ferroelectric domains. Most memory materials are optimized for rapid switching and stability over many, $>10^6$ cycles. The stability of the remnant polarization over temperature extremes that are likely to be encountered by electronic devices. Other significant variables include the growth orientation of the ferroelectric crystals and whether the material is ferroelectric or antiferroelectric.

An antiferroelectric state is defined as one in which lines of ions in a crystal are spontaneously polarized, but with neighboring lines polarized in antiparallel directions. In simple cubic lattices the antiferroelectric state is likely to be more stable than the ferroelectric state. The dielectric constant above and below the antiferroelectric Curie point is investigated for both first and second-order transitions. In either case the dielectric constant need not be very high; but if the transition is second order, $\in$ is continuous across the Curie point. The antiferroelectric state will not be piezoelectric. The thermal anomaly near the Curie point will be of the same nature and magnitude as in ferroelectrics. A susceptibility variation of the form $C/(T+\theta)$ as found in strontium titanate is not indicative of antiferroelectricity, unlike the corresponding situation in antiferromagnetism.

The selection of a ferroelectric material can come from two categories of materials, the more common displacive type of which $BaTiO_3$ is prototypical. The magnitude of displacive movement of ions is described elsewhere. And the order-disorder type where polar molecules line up to create a large dipole moment, such as polymer like poly-vinylidene fluoride.

While there are dissimilarities between the two types of generators, there are some similarities which might improve the efficiency of both types of devices. In the electrical generation cycle, the supply of charge could be enhanced by providing a continuous supply of electrons. An earth ground is known to be a supply of electrons. Both devices also depend on electrodes to carry the current. Sometimes, as shown in the Examples, the active element may also serve as an electrode. An enhancement to the operation of the devices would be the use of high surface area electrodes. Carbon and ruthenium oxide have previously been used in the fabrication of capacitors to either increase the stored charge or reduce the size of the devices. More efficient electrodes can be selected from those that impart an n-type or p-type behavior depending on polarity.

Electric generators within the scope of the present invention can be fabricated using a number of known techniques. These may include three separate groupings, namely thin-film fabrication methods; thick-film fabrication methods; and bulk processing. Thin film methods may include, but are not limited to, CVD, MOCVD, ion assisted sputtering, laser ablation, MBE, and spin-on liquids. Thick-film methods may include, but are not limited to screen printing, tape casting, and polymerization coatings. Bulk processing methods may include, but are not limited to, pressing and hot-pressing.

It will be appreciated that electric generators within the scope of the present invention may be used to provide constant electric current sufficient to "trickle charge" batteries and capacitors which power a wide variety of electronic devices, such as cell phones, PDAs, notebook computers, GPS devices, portable music players, flashlights, remote control devices, radios and communication devices, and so forth. Other electric generators may provide power for discrete circuit board chips and medical applications, such as medical implants for pacemakers and electrical stimulation for pain management.

Electric generators within the scope of the present invention may be fabricated at a sufficient scale to provide stand-alone electric power generation for remote locations, homes, businesses, automobiles, boats, and so forth. Military applications may include electric generators for satellites, space probes, and field applications.

These and other features and advantages of the present disclosure may be incorporated into electrical generation devices, methods, and compositions and will become more fully apparent from the following description and appended claims, or may be learned by the practice and implementation of the present disclosure. As described above, the present disclosure does not require that all of the features described herein be incorporated into every embodiment nor is it required that certain features be used exclusive of other features. Electrical generation devices, compositions, and methods within the scope of the present disclosure may include one or more combinations of the features described herein.

BRIEF DESCRIPTION OF THE DRAWINGS

In order that the above-recited and other features and advantages of the disclosure may be readily understood, a more particular description is provide below with reference to the appended drawings. These drawings depict only exemplary embodiments of vascular access devices according to the present disclosure and are not therefore to be considered to limit the scope of the disclosure.

DETAILED DESCRIPTION OF THE INVENTION

It will be readily understood that the components of the present disclosure, as generally described and illustrated in the figures herein, could be arranged and designed in a wide variety of different configurations. Thus, the following more detailed description, as represented in the figures, is not intended to limit the scope of the disclosure, but is merely a representative of exemplary combinations of the components.

Figure 1:
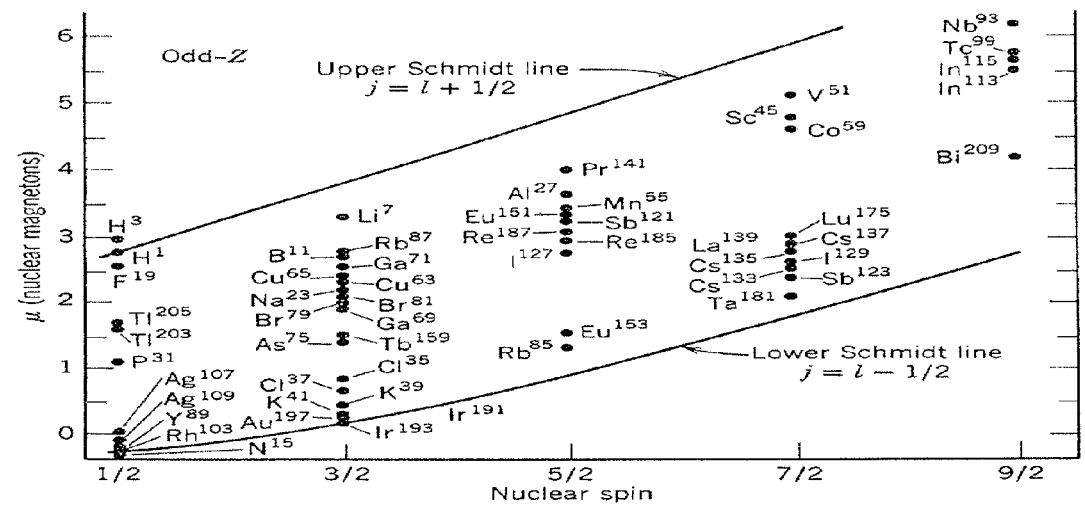
FIG. 1 is a graph of measured magnetic dipole moments of even-N, odd-Z nuclei and of odd-N and even-Z nuclei.
Figure 1:
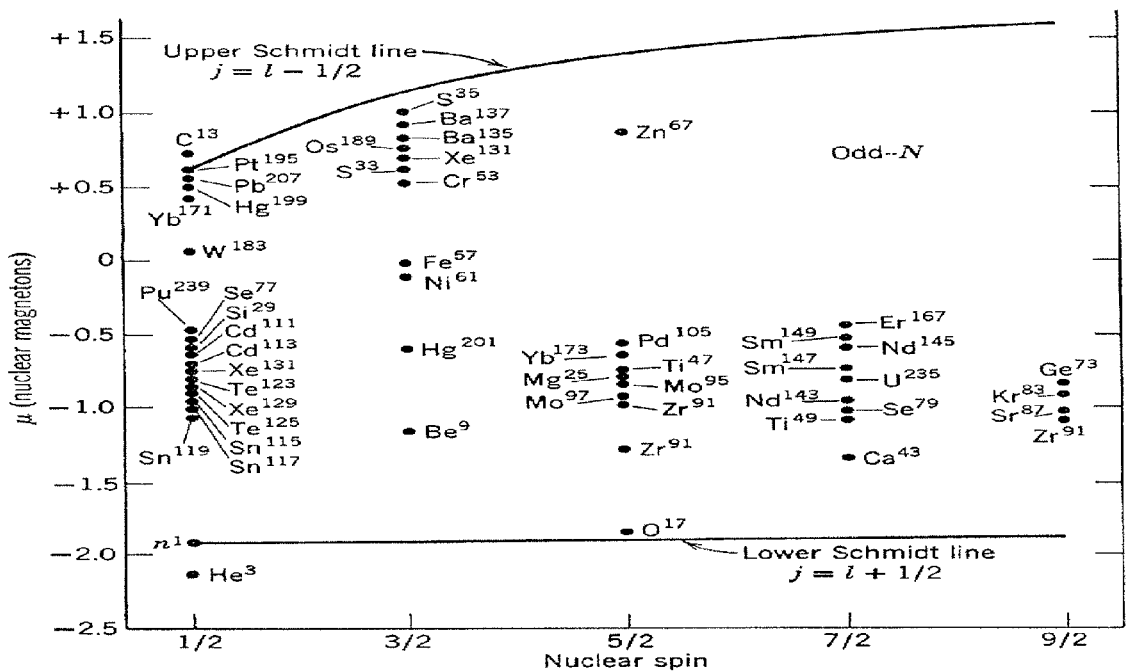

As discussed above, one aspect of the present invention is the production of an electric generation device by the application of NMS. As set forth in FIG. 1, the spin of the nucleus can be defined by odd and even designations. The top graph in FIG. 1 shows the measured magnetic dipole moments of even-N, odd-Z nuclei. Z is the atomic number, and N is the number of neutrons in an atom or isotope. The upper Schmidt line is the predicted values if the spin and orbital angular momenta of the odd proton are parallel to each other. The lower Schmidt line is the predicted values if the spin and orbital angular momenta of the odd proton are anti-parallel to each other. The lower graph shows the measured magnetic dipole moments of odd-N, even-Z nuclei.

Nuclei with spin >1 also possess electrical quadrupole moments, which are linked to the spin axis, and give rise to energy terms when they are in electric field gradients, especially those derived from valence electrons. For nuclei, the electrical dipole moments are zero and the primary electrical term, apart from the charge itself, is the electrical quadrupole moment. This may be thought of as describing the non-spherical shape of the nuclei. The spin axis is necessarily an axis of cylindrical symmetry, but the nucleus may be elongated along the polar axis, in which case the quadrupole moment is positive. Conversely, some nuclei are flattened at the poles, with an elongated equatorial axis, when the moment is negative. See FIG. 2 for a diagram of these two geometries. The equation, Q=the integral of $\rho r^2(3 \cos^2\theta - 1) d\tau$, is a definition of the quadrapole moment Q, $\rho$ is the charge density per unit volume, r is the distance of the volume element, dt from the origin and theta is the angle between the radius vector and the spin quantization axis. Q has the dimensions of length squared.

The nuclear quadrupole moment interacts with the gradients of the electric field, E, in which it is situated. These gradients are the second derivatives of the electric potential, V. These quantities are commonly denoted by q with appropriate subscripts to indicate the directions. The z direction is taken as the maximum field gradient. This is an issue that increases efficiency of charge generation.

The even spin numbers have larger values when compared with the odd values. The even designations can be modeled as shown below in FIG. 2. A nucleus with even-N and odd-Z is shown on the left of FIG. 2, and a nucleus with odd-N and even-Z is shown on the right.

Figure 2:
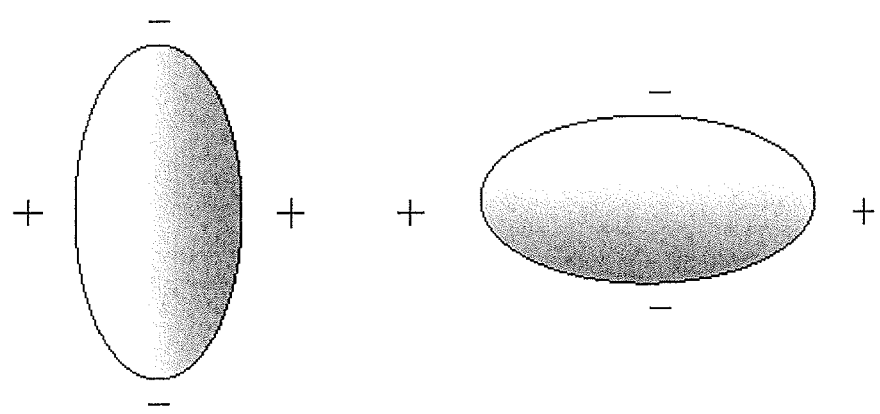
FIG. 2 is a schematic representation of a nucleus with even-N and odd-Z, shown on the left side, and a nucleus with odd-N and even-Z, shown on the right side.

It can be seen from FIG. 2 that the nuclear magnetic spin is a measure of the non-spherical geometry of the nucleus. The larger values for the spin the more non-spherical the nucleus. The nuclei with the largest angular momentum will come from the properties shown in the right hand diagram, a nucleus with odd-N and even-Z.

Figure 3:
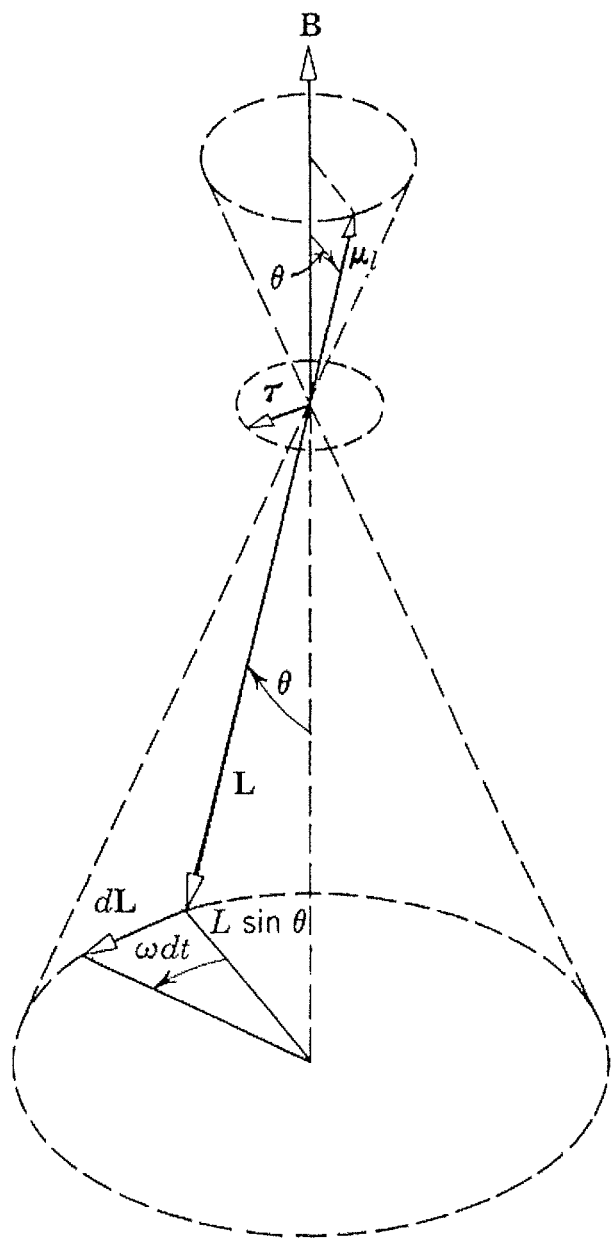
FIG. 3 is a schematic representation of the geometry of an oscillating nucleus.

In order to take advantage of the largest angular momentum and convert that motion into an oscillating electron one must consider the influence that nuclear oscillations have on an electron. FIG. 3 shows the geometry of an oscillating nucleus.

There is no way for the system to dissipate the orientational potential energy $\Delta E$, for a magnetic dipole moment in a magnetic field. Then the magnetic dipole moment cannot align itself with the magnetic field. Instead, the magnetic dipole moment will precess around the B field axis. The processional motion is a consequence of torque (T) acting on the dipole. The following equation gives the magnitude of the angular frequency of precession of $\mu_1$ about B.

$$\omega = \frac{g_l \mu_b}{\hbar} B \qquad \text{Equation 1}$$

This phenomenon is known as the Larmor precession and $\omega$ is the Larmor frequency.

The torque $T = \mu_1 \times B$. Equation 2

Some of the notations have changed from the earlier discussion. This comes from the figures and notation differences from the reference books. But, one should be able to discern where the notations change; i.e. 1 used earlier is from reference 1 and is equivalent to the $\mu_1$ used in reference 2.

The Bohr magneton is given by the following equation.

$$\mu_b = \frac{e\hbar}{2m} \qquad \text{Equation 3}$$

Equation 4 gives the average force acting on the magnetic dipole.

$$\overline{F_z} = \frac{\partial B_z}{\partial z} \mu_{l_z} \qquad \text{Equation 4}$$

The net effect of these equations is that with a precessional motion of a nucleus that has a non-spherical shape, in particular one that has an elongated "equator," there is a non-spherical distribution of positive charge within the nucleus. This positive charge distribution has a coulomb effect on the electrons, especially valence electrons, whose motion in a magnetic field will generate a spontaneous, continuous charge on a ferroelectric or capacitor-like material.

The magnitude of energy that can be generated is approximated by $2\mu_I B$. This equation corresponds with the amount of energy required to flip a magnetic dipole within a magnetic field from a parallel orientation with the B field to the antiparallel orientation with the B field. If we assume that, the magnetic field is 1 tesla and we are using one mole of praseodymium whose magnetic spin is 5/2 then the amount of energy derived from this example is about 27.8 Joules. The following example using praseodymium shows how this number was obtained.

The energy to align a dipole is given by the equation $\Delta E = \mu_1 \cdot B$; where $\mu_1$ is the nuclear magnetic moment (5/2) for praseodymium and is B is the magnetic field strength which we are assuming to be 1 tesla. Then 2 times the $\mu_1$ gives the total energy required for alignment with and against the magnetic field. We then have for the energy $E = 2(5/2)0.927 \times 10^{-23}$ amp-m$^2 \times 1$ Joule/amp-m$^2$ or $4.635 \times 10^{-23}$ Joules/atom. The number $0.927 \times 10^{-23}$ amp-m$^2$ is the value of a Bohr magneton. Now we have the energy liberated when a praseodymium nucleus changes its spin from being oriented parallel with the magnetic field to antiparallel with the magnetic field. For 1 mole of atoms, the energy liberated is $E = 4.635 \times 10^{-23}$ Joules/atom$\times 6.022 \times 10^{23}$ atoms/mole$= 27.9$ Joules/mole. A Joule$\times$second is a watt, so the amount of energy that we could potentially liberate from a mole of praseodymium is 27.9 watts.

There are several vibrational modes within atoms and molecules. Most vibrational modes are in the microwave range and higher, such as thermal vibrations ($\sim 10^{13}$ Hz at room temperature), electron motions, etc. Some vibrations are measured in the megahertz range and below. These vibrations can be advantageous for the generation of electricity. Examples of these types of devices are those based on piezoelectric properties, such as those seen in igniters; and pyroelectric generators, which use a difference in temperature to generate a charge. The Larmor frequency of precession described above are usually measured in the 0.1 to 20 megahertz range. This is a frequency that can be used because it corresponds with the frequencies of electronic components to generate a charge, as in the case of other atomic vibrations. The advantage of this frequency range is that it has not been previously exploited. And, this frequency range is within the range where external electronic circuits can be used to optimize the internal harmonic vibrations. The use of external circuits would allow for the extraction of AC currents from DC currents from the interaction of the piezoelectric crystal. Building a device from this example one could construct large area devices similar to capacitor structures given by the following equations and discussion. A capacitance equation is given by $C = k \in_0$ Area/thickness   Equation 5

Where C is the capacitance, $\in_0$ is the permittivity of free space, and k is the dielectric constant of a material between electrodes.

Also, $C = q/V$   Equation 6

And, solving for the voltage we get the following equation $V = (q \times d)/k \in_0$ Area   Equation 7

And $E = \frac{1}{2} CV^2$   Equation 8

These equations relate to optimization of the design of a device. The device should have layers that are as thin as possible and the area should be large. An alternative design may incorporate high nuclear magnetic spin atoms within a ferroelectric host. The virtue of this design is that it would have the most intimate contact between the spin material and the ferroelectric material.

Figure 4:
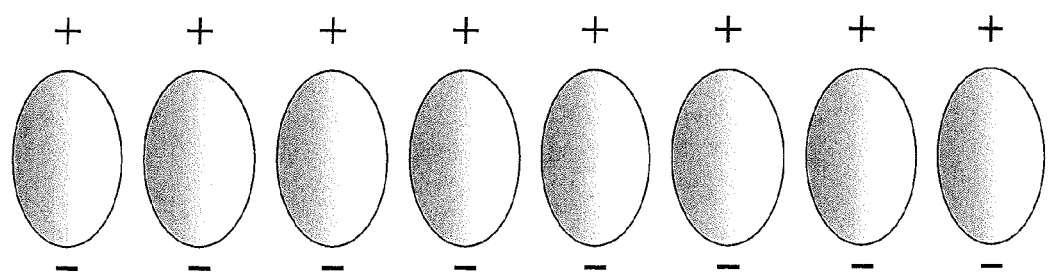
FIG. 4 is a schematic representation of a ferroelectric material having aligned dipoles.

Ferroelectricity is characterized by a permanent electrical dipole moment in a crystal. In a ferroelectric material, the dipoles are randomized within the solid structure. With poling, there is an alignment of dipoles. Poled ferroelectric materials are preferred. This alignment of dipoles is schematically shown in the FIG. 4. In principle, the electric generator within the scope of the invention should have a large surface area. One way of obtaining a large surface area is to fabricate the electric generator with multiple layers, and the layers should be as thin as possible. Many commercially available ferroelectrics have the perovskite structure.

Ferroelectric thin films are known for use in nonvolatile ferroelectric random access memory (NV-FRAM) devices. Various techniques for fabricating ferroelectric films are known. One such method includes thin film deposition techniques, such as sputtering or MOCVD, which produce amorphous films, followed by annealing. Typically, crystallization progresses through intermediate phases. For example, when annealing lead-zirconate-titanate (PZT), the pyrochlore phase forms first followed by the perovskite phase.

Table 2 lists characteristics of some ferroelectric materials. The term $P_s$ represents a measure of ferroelectric material's surface charge density or its ability to store charge.

TABLE 2

Characteristics of Some Ferroelectric Materials

| Material | $T_c$ (K) | $P_s$ (uC/cm$^2$)$^a$ |
|---|---|---|
| Ammonium dihydrogen phosphate (ADP) $NH_4H_2PO_4$ | 148 | 0$^b$ |
| Barium cobalt fluoride $BaCoF_4$ | c | |
| Barium titanate $BaTiO_3$ | (183) (278) (393) | ~20 |
| Boracite $Mg_3B_7O_{13}Cl$ | 538 | 0.05 |
| Guanidinium aluminum sulfate hexahydrate (GASH) $C(NH_2)_3Al(SO_4)_2 \cdot 6H_2O$ | d | 3.5 |
| Lead titanate $PbTiO_3$ | 763 | ~75 |
| Lead zirconate $PbZrO_3$ | 503 | 0$^b$ |
| Lithium niobate $LiNbO_3$ | 1473 | 71 |
| Lithium tantalite $LiTaO_3$ | 938 | 50 |
| Potassium dihydrogen phosphate (KDP) $KH_2PO_4$ | 123 | 5$^e$ |
| Rochelle salt $NaKC_4H_4O_6 \cdot 4H_2O$ | (255) (297) | 0.25$^f$ |
| Sodium niobate $NaNbO_3$ | (73) (627) | 0$^b$ |
| Terbium molybdate (TMO) $Tb_2(MoO_4)_3$ | 436 | 0.2 |
| Triglycine sulfate (TGS) $(NH_2CH_2COOH)_3 \cdot H_2SO_4$ | 322 | 2.8 |

Figure 5:
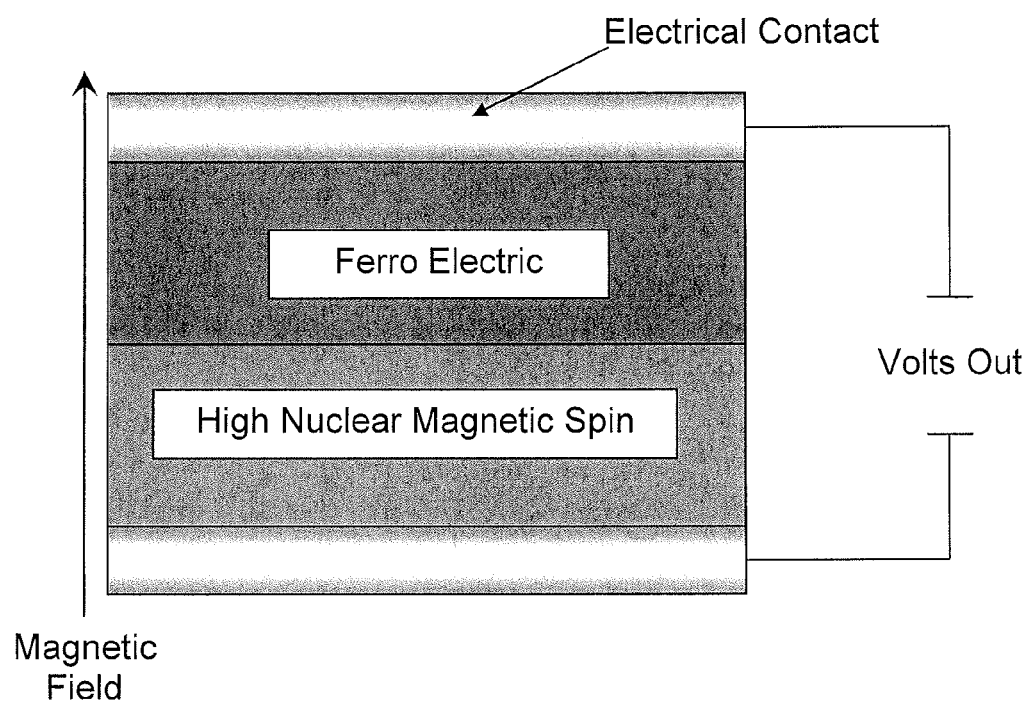
FIG. 5 is a schematic representation of an electric generator within the scope of the present invention

$^a$($10^{-2}$coulombs/m$^2$) Values of $P_s$ are for single crystals at room temperature
$^b$Antiferroelectric at room temperature
c Melts below $T_c$
d Decomposes at about 273 K
$^e$At 100 K
$^f$At 280 K Electrical Generator Structure FIG. 5 shows a schematic representation of the basic components of an electric generator within the scope of the present invention. The electric generator includes a first material with high nuclear magnetic spin or high remnant polarization, and a poled ferroelectric material closely associated with the first material. As used herein, a material with high nuclear magnetic spin will have a spin of ½ or greater. This means that the nucleus of the atom is flattened or elongated. Materials with higher spin values will enable greater power generation. The spin should not be so high that radioactivity occurs, except in those applications that are strictly controlled. Examples of high nuclear magnetic spin materials are shown in FIG. 1. High spin isotopes with high natural abundance that also possess "odd" spin characteristics are preferred. The elements, Pr, Mn, and Mg are presently preferred. As used herein, the term "closely associated" includes adjacent layered materials and mixed materials.

The high nuclear magnetic spin material and ferroelectric material are disposed between electrical contacts. The electrical contacts may be metallic materials. In a presently preferred embodiment, one electrical contact is an acceptor or high work function material, such as tantalum, gold, platinum or other known acceptor materials. The other electrical contact is a donor material, such as a low work function material. Examples of high work function materials include, but are not limited to, silver (4.64 eV), Ni (5.22 eV), aluminum (4.20 eV), and tantalum (4.15 eV). Some examples of low work function metals include, but are not limited to the alkali metals such as sodium (2.36 eV) or the rare earth metals such as europium (2.5 eV).

A magnetic field is applied to the high nuclear magnetic spin material. The magnetic field can be introduced by adding a magnetic material internally to the overall composition of the device or the magnetic field can be applied externally. The strength of the magnetic field may affect the coupling efficiency of the device. Preferably the magnetic field may be tuned for harmonic resonance to optimize device performance. The typical strength of an effective magnetic field that may be used with the invention may range between 0.01 Tesla and 10 Tesla.

For a generator within the scope of the invention to be used continuously, an inductor, which stores charge for a short time, may be required for optimal performance. The time of charge storage is determined by the capacitance and the inductance of each power element. The combination of the capacitance and the inductance gives a time constant typical of LC circuits. The capacitance and inductance will change for each application. For intermittent use, the need for the inductor is less important. For continuous use, in each power element there should be an inductor either built into the device or integrated externally.

The schematic device shown in FIG. 5 can be implemented using thick or thin-film processes or combinations of the two. Examples of thick-film processes are described in the following sections. But, thin-film processes can be implemented to optimize the size and performance of the device.

Figure 6:
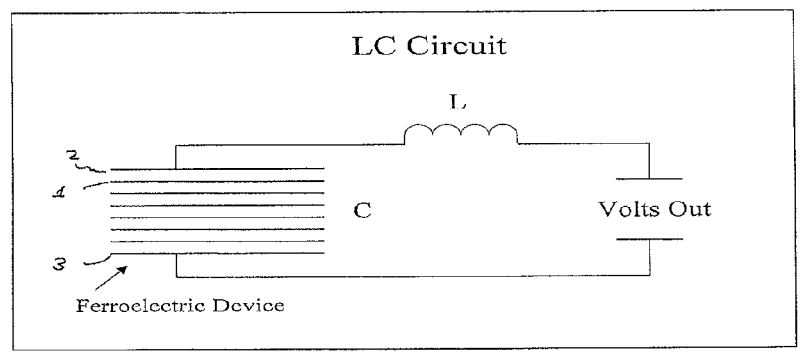
FIG. 6 is a schematic representation of an electric generator within the scope of the present invention employing multiple layers of materials.
Figure 7:
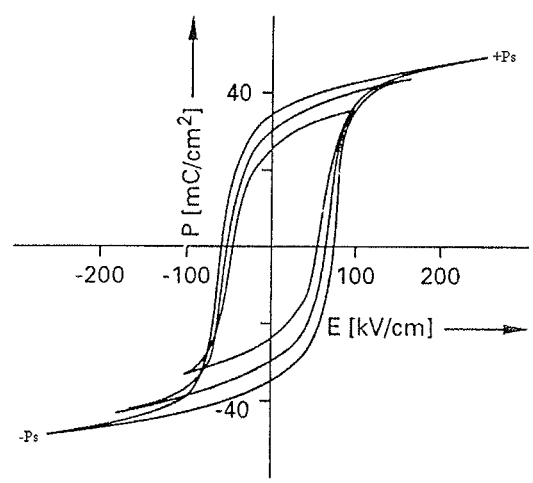
FIG. 7 is a graph illustrating the general shape of the hysteresis loop.
Figure 8:
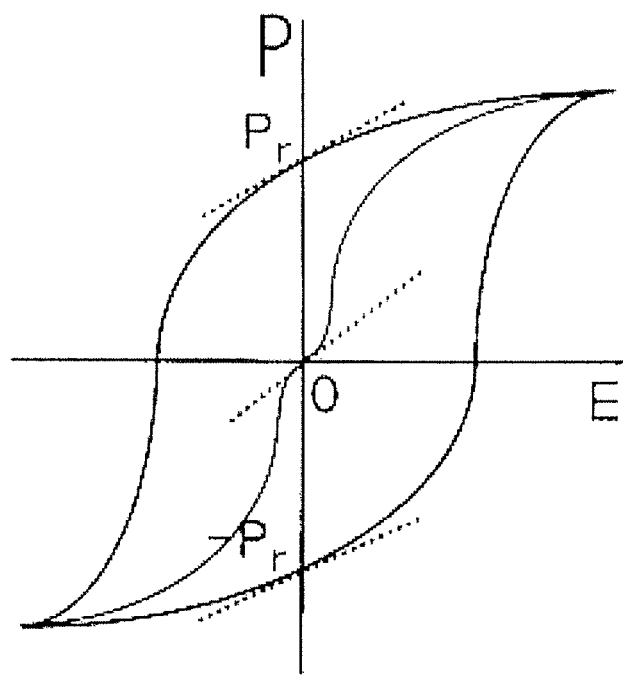
FIG. 8 is a graph illustrating remnant polarization.

FIG. 6 is a schematic diagram of a multiple layer device within the scope of the present invention. Several layers of material are layered one on top of the other. As with the device illustrated in FIG. 5, this device includes layers of a first material with either with high nuclear magnetic spin or high remnant polarization, designated 1, and a poled ferroelectric material, designated 2, closely associated with the first material. Also illustrated in FIG. 6 is a layer of magnetic material 3 disposed adjacent to a least one of the layers of poled ferroelectric material or first material Electrical contacts are provided in order to collect voltage output from the multilayer device. In addition, an inductor, as discussed above, is illustrated.

Figure 9A:
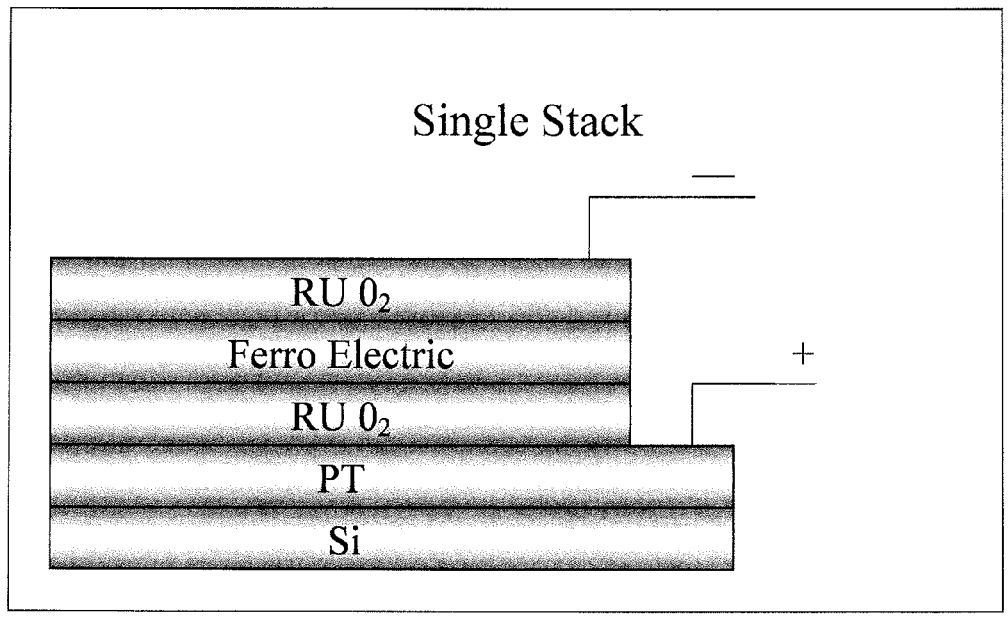
FIGS. 9 ($a$) and ($b$) are schematic representations of electric generators within the scope of the present invention.
Figure 9B:
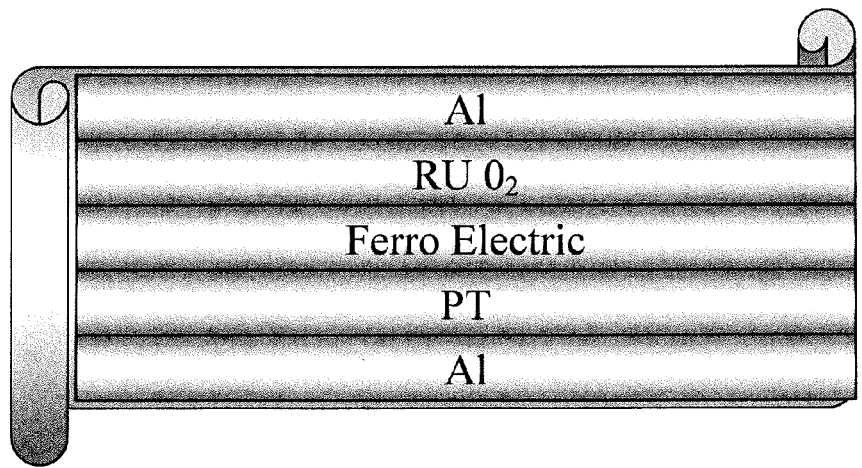
Figure 10:
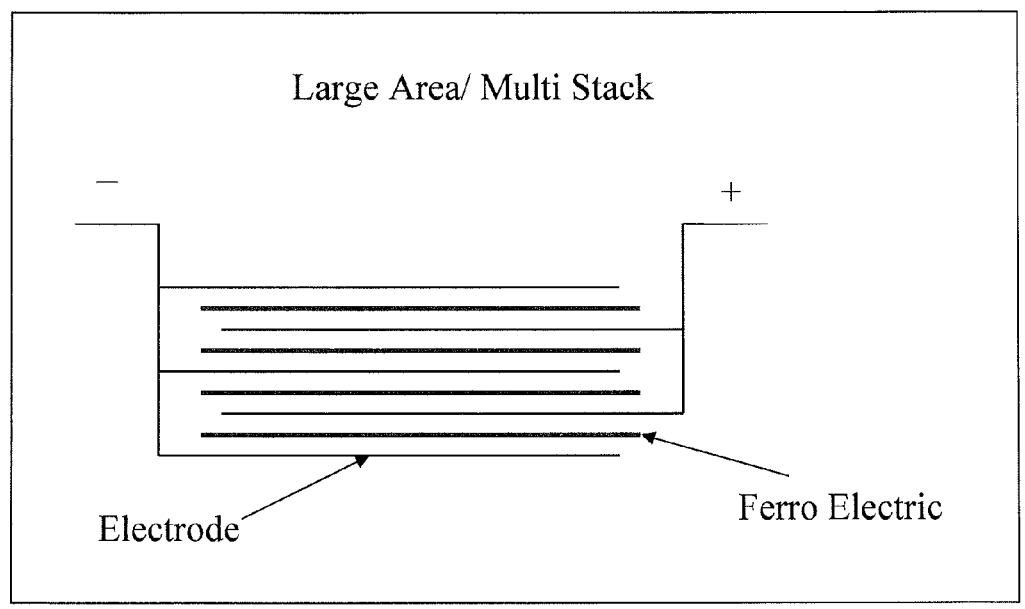
FIG. 10 is a schematic representation of a large area/multi stack electric generator within the scope of the present invention.

FIGS. 9 and 10 are schematic diagrams of larger "multi stack" devices. Once again, these devices are comprised of multiple layers of the materials discussed herein.

FIGS. 9a and 9b show schematics of a ferroelectric generator using high surface area electrodes, such as ruthenium oxide. In this case the active device is grown on a silicon substrate. FIG. 10 shows a repeating stack of the single unit shown in FIG. 9. With the use of flexible electrodes and thin-films these stacks can be rolled for more efficient packing or use of space.

The following outlines the possible structure of a solid state electric generator using ferroelectric materials.

Barium titanate is a typical of a displacive type of ferroelectric. Polarization causes an ion to be displaced slightly from its equilibrium position. This leads to an asymmetrical shift in the equilibrium ion positions and causes the formation of a permanent dipole moment. In an order-disorder ferroelectric, there is a dipole moment in each unit cell. At high temperatures, the dipole vectors point in random directions. For each composition of ferroelectric material, there is a phase transition temperature called a critical temperature, denoted by (Tc). If a ferroelectric at a temperature greater than Tc is cooled in an externally applied electric field, the dipoles will become ordered with most of the dipole vectors pointing in the same direction.

Ferroelectric crystals often show several transition temperatures and domain structure hysteresis, much as do ferromagnetic crystals. The nature of the phase transition in some ferroelectric crystals is still not well understood.

In 1921 J. Valasek, during an investigation of the anomalous dielectric properties of Rochelle salt ($NaKC_4H_4O_6.4H_2O$) showed that this material exhibited ferroelectric properties. A second ferroelectric material, $KH_2PO_4$, was not found until 1935 and was followed by some of its isomorphs. The third ferroelectric, $BaTiO_3$, was reported by A. von Hippel in 1944. Since then, about 250 single phase materials and many more mixed crystal systems having been discovered.

A crystal is ferroelectric if it has internal dipoles that can be aligned depending on the application of an external electric field larger than the coercive forces fixing the dipole vectors in the crystal. Ps is the saturation polarization, or the largest degree of alignment of dipoles. Reversal of the dipoles is also known as switching. The resulting states for each orientation are energetically and symmetrically equivalent in a zero external electric field. Crystalline properties, such as the defect distribution and conductivity, together with temperature, pressure, and electrode conditions, may affect the ferroelectric reversal. Most ferroelectrics have characteristic values of $P_s$ and $T_c$. Reversal or reorientation of $P_s$ is always the result of atomic displacement.

The spontaneous polarization in most ferroelectric crystals is greatest at temperatures well below $T_c$ and decreases to zero at $T_c$. If the high-temperature phase also shows polar properties, $P_s$ may merely pass through a minimum at $T_c$; similarly, if another phase forms at lower temperatures, $P_s$ may increase, decrease or become zero below that transition.

The application of a dc field higher than the coercive field along a direction in a multi-domain ferroelectric crystal results in the parallel orientation of all $P_s$ vectors. The minimum de field required to move domain walls is a measure of the coercive field. The initial value of $P_s$ in a multi-domain crystal increases with increasing dc field to a maximum that is characteristic of the material. Reversing the field reintroduces domain walls as the sense of $P_s$ in different regions is reversed. If there is no externally applied field, the crystal will have a remnant polarization no larger than the spontaneous polarization, and is usually less than $P_s$. At full reverse field, the final $P_s$ will have magnitude equal to the original full $P_s$ but of opposite sign. The hysteresis thus observed is a function of the work required to displace the domain walls and is closely related both to the defect distribution in the crystal and to the energy barrier separating the different orientational states.

The spontaneous polarization of single-domain materials usually lies within the range 0.001 $C/m^2$ to 10 $C/m^2$. Numerical values are customarily given in units of $10^{-2}$ $\mu C/cm^2$. The magnitude of $P_s$ in a single crystal is directly related to the atomic displacements that occur in ferroelectric reversal and may be calculated from the atomic positions within the unit cell, if they are known. If $D_i$ as the component of the atomic displacement vectors joining the ith atom positions in the original and reversed orientations along the direction of $P_s$, $Z_i$ as the effective charge, and V as the unit cell volume, then $P_s=(\frac{1}{2}V) S_i Z_i D_i$. The spontaneous polarization may be experimentally derived directly from the charge density obtainable by careful x-ray diffraction structural measurements.

The arrangement of the atoms in displacive ferroelectric crystals is such that small displacements, usually less than 1 Å, result in a stable state but with reoriented $P_s$. The midposition arrangement corresponds to a higher symmetry structure. The orientation of dipoles is not necessarily random, since dipoles in this state are either all zero or exactly cancel. A simple example is $BaTiO_3$ for which the "prototype" crystal structure is cubic, with barium atoms at the corners, a titanium atom at the body center and oxygen atoms at center of faces of the cubic unit cell. Below a Curie temperature of 393 K, the crystal structure is tetragonal as the titanium atom is displaced by about 0.05 Å from its prototype position along the c-direction and the oxygen atoms are displaced in the opposite sense by about 0.08 Å, as referenced to the barium atom positions. The resulting displacements give rise to the spontaneous polarization. An electric field applied along the c axis can displace the titanium atom by about 0.1 Å and O by about 0.16 Å, reverses the sense of this axis and also that of $P_s$.

The relative sense of $P_s$ in a crystal is given by the charge developed on the polar faces as a single domain crystal is cooled below $T_c$. This sense can be related to the atomic arrangement by making use of the anomalous scattering in an x-ray diffraction experiment. All known experimental determinations of the absolute sense of $P_s$ are in agreement with the sense as calculated from the effective point charge distribution; thus, in tetragonal $BaTiO_3$, the absolute sense is given by the direction from the oxygen layer toward the nearest Ti ion. Once electric field is turn off and there is no domain change then $P_s$ is equal to remnant polarization.

Ferroelectric materials may be divided into three classes on the basis of the nature of the displacement vectors $D_i$ that produce reversal of $P_s$. The one-dimensional class involves atomic displacements all of which are parallel to the c-axis, as in the case of tetragonal $BaTiO_3$. In this class, $P_s$ is about 0.25 $C/m^2$. The two-dimensional class involves atomic displacements in a plane containing the polarized axis. An illustrative example follows using $BaCoF_4$:

This perovskite has a range of $P_s$ values ranging from 0.1 $C/m^2$ to 0.3 $C/m^2$. The three-dimensional class involves atomic displacements of similar magnitude in all three dimensions. A typical example is $Tb_2(MoO_4)_3$. In this class, $P_s$ is about 0.5 $C/m^2$.

Some ferroelectric materials are listed in Table 3. Potassium di-hydrogen phosphate (KDP) transforms from the orthorhombic ferroelectric phase to the nonpolar but piezoelectric tetragonal phase at 123 K. Rochelle salt has two Curie temperatures, transforming from nonpolar but piezoelectric orthorhombic at 255 K to ferroelectric monoclinic returning at 297 K to orthorhombic but with a slightly altered structure.

Barium titanate has three ferroelectric phases and three Curie temperatures: it is rhombohedral below 183 K, another orthorhombic phase between 183 and 278 K, and tetragonal between 278 and 393 K; and becomes cubic above 393 K. Sodium niobate transforms from ferroelectric trigonal to antiferroelectric orthorhombic at 73 K, to non-polar orthorhombic at 627 K, and to four additional nonpolar phases at higher temperatures.

TABLE 3

Ferroelectric Properties of Selected Materials

| Formula | $T_c$ (K) | $P_s$ (C/m$^2$)$^a$ | $P_r$ (C/m$^2$) |
|---|---|---|---|
| $NH_4H_2PO_4$ | 148 | 0$^b$ | |
| $BaCoF_4$ | c | 0.8 | |
| $BaTiO_3$ | 183,278,393 | ~0.2 | 0.15 |
| $Mg_3B_7O_{13}Cl$ | 538 | 0.0005 | |
| $BiFeO_3$ | ~925 | ~1.5 | 0.90 |
| $PbTiO_3$ | 63 | ~0.75 | 0.30 |
| $PbZrO_3$ | 503 | 0$^b$ | ~0.25 |
| $LiNbO_3$ | 1473 | 0.71 | 0.01 |
| $LiTaO_3$ | 938 | 0.5 | |
| $KH_2PO_4$ | 123 | 0.05$^e$ | |
| $SrBi_2Nb_2O_9$ | | | 0.38 to 0.50 |
| $NaNbO_3$ | 73,627 | 0$^b$ | |
| $Tb_2(MoO_4)_3$ | 436 | 0.0002 | |
| $(NH_2CH_2COOH)_3 \cdot H_2SO_4$ | 322 | 0.028 | |

$^a$Values of $P_s$ are for single crystals at 25° C. unless specified otherwise
$^b$Antiferroelectric at room temperature
c Melts below $T_c$
d. Decomposes at about 273 K
$^e$Decomposes at 100 K A poled ferroelectric crystal may be obtained by first heating the material above the $T_c$. Then applying a sufficiently large (greater than the coercive force) external electric field and cooling the ferroelectric material below Tc. When the electric field is removed and the material cooled to room temperature the maximum polarization is realized. Over time the polarization may or may not decay depending on the stability of the material. This resulting polarization is termed "remnant polarization." In some cases the remnant polarization may remain the same as the spontaneous polarization.

For the maximum output of the remnant polarization generator, it is desirable to use a material that has a high, stable, predictable remnant polarization. This is accomplished by retaining stable ferroelectric domains.

For an estimation of how much power can be generated by a layered ferroelectric device, we will use familiar equations and terms from capacitor concepts. In this case, we would choose one of the largest remnant polarization materials.

For example $BiFeO_3$ grown on ZnO has a Pr of about 0.90 C/m$^2$.

DEFINITIONS

1 C=coulomb=1 ampere×second
2 C=1 farad (F)×volt (V)
3 joule/second=watt
4 joule=½(volt)$^2$×coulomb
5 joule =(C×V)/2

From the above, we can say $BiFeO_3$ has a Pr of about 0.90 C/m$^2$.

If we assume that we have a potential of 20 volts per layer and from

Definition 2, we find that there are 0.90 C/m$^2$/20 volts=0.045 F per layer.

From Definition 6, we can determine that the generated energy per layer would be Energy=[20V×0.045 Farads]/2=9.0 joules If we assume that the charging time (t) for a capacitor is equivalent to the charging time of the generator, then assume that the following equation applies; t(seconds)=ohms×capacitance Now we need to assume some internal losses, so, if the internal resistance is about 10 ohms/m$^2$. Then: 10 ohms× 0.045 farads=0.45 seconds. Then from Definition 4, we find that the power is about 9.0 joules/0.45 seconds 20 watts of continuous power. Then for a complete device with 1,000 layers at 20 watts per layer could yield 20,000 watts. Thus, a continuous power generator could be produced using the RPEG mechanism.

Table 4 provides reference information for selected elements which are candidates for use in the present invention.

TABLE 4

Reference Information

| Element | Natural Abundance (Atom %) | Atomic Mass or Weight | Half-life/ Resonance Width (MeV) | Decay Mode/ Energy (/MeV) | Particle Energy/ Intensity (MeV/%) | Spin (h/2π) | Nuclear Magnetic Mom. (nm) | Elect. Quadr. Mom. (b) | γ-Energy/ Intensity (MeV/%) |
|---|---|---|---|---|---|---|---|---|---|
| $_1$H | | 1.00794(7) | | | | | | | |
| $^1$H | 99.9885 (70) | 1.007825032 | >2.8 × 10$^{23}$ y | | | ½+ | +2.79285 | | |
| $^2$H | 0.0115 (70) | 2.014101778 | | | | 1+ | +0.85744 | +2.86 mb | |
| $^3$H | | 3.016049268 | 12.33 y | β$^-$/0.01859 | 0.01860/100. | ½+ | +2.97896 | | |
| $^4$H | | 4.0278 | Γ≈3 | n/ | /100 | 2− | | | |
| $^5$H | | 5.040 | Γ = 1.9 (4) | n/ | /100 | (½+) | | | |
| $^6$H | | 6.0449 | Γ = 1.6 (4) | n/ | | (2−) | | | |
| $_{12}$Mg | | 24.3050(6) | | | | | | | |
| $^{20}$Mg | | 20.01886 | 96. ms | β$^+$/10.73 β$^+$, p | /70 /30 | 0+ | | | |
| $^{21}$Mg | | 21.01171 | 122. ms | β$^+$, p/13.10 | | 5/2+ | | | 0.332/51. |
| $^{22}$Mg | | 21.999574 | 3.86 s | β$^+$/4.786 | 3.05/ | 0+ | | | 0.0729/60. 0.5820/100. (1.28-1.93) |
| $^{23}$Mg | | 22.994125 | 11.32 s | β$^+$/4.057 | 3.09/92. | 3/2+ | 0.536 | 1.25 | 0.440/8.2 |
| $^{24}$Mg | 78.99 (4) | 23.9850419 | | | | 0+ | | | |
| $^{25}$Mg | 10.00 (1) | 24.9858370 | | | | 5/2+ | −0.85545 | +0.200 | |
| $^{26}$Mg | 11.01 (3) | 25.9825930 | | | | 0+ | | | |
| $^{27}$Mg | | 26.9843407 | 9.45 m | β$^+$/2.6103 | 1.59/41. 1.75/58. 2.65/0.3 | ½+ | | | 0.17068/0.9 0.84376/72. 1.01443/28 |

TABLE 4-continued

Reference Information

| Element | Natural Abundance (Atom %) | Atomic Mass or Weight | Half-life/ Resonance Width (MeV) | Decay Mode/ Energy (/MeV) | Particle Energy/ Intensity (MeV/%) | Spin (h/2π) | Nuclear Magnetic Mom. (nm) | Elect. Quadr. Mom. (b) | γ-Energy/ Intensity (MeV/%) |
|---|---|---|---|---|---|---|---|---|---|
| $^{28}$Mg | | 27.983877 | 20.9 h | $\beta^-$/1.832 | 0.459/95. | 0+ | | | 0.0306/95. 0.4006/36. 0.9418/36. 1.342/54. |
| $^{29}$Mg | | 28.98855 | 1.3 s | $\beta^-$/7.55 | 5.4/ | 3/2+ | | | 0.960/15. 1.398/16. 2.224/36. |
| $^{30}$Mg | | 29.9905 | 0.32 s | $\beta^-$/7.0 | | 0+ | | | 0.224/85. |
| $^{31}$Mg | | 30.9966 | 0.24 s | $\beta^-$/11.7 $\beta^-$, n | /≈6. | (3/2+) | | | 1.61/26. |
| $^{32}$Mg | | 31.9992 | 0.12 s | $\beta^-$/10.3 | | 0+ | | | 2.765/25. |
| $^{33}$Mg | | 33.0056 | 91. ms | $\beta^-$/13.7 $\beta^-$, n | /83. /17. | | | | 1.848/ |
| $^{34}$Mg | | 34.0091 | 0.02 s | $\beta^-$/11.3 | | 0+ | | | |
| $^{35}$Mg | | 35.0175 | 0.07 s | | | (7/2−) | | | |
| $^{36}$Mg | | 36.022 | >0.2 μs | | | 0+ | | | |
| $^{37}$Mg | | 37.031 | >0.26 μs | | | (7/2−) | | | |
| $^{38}$Mg | | | | | | 0+ | | | |
| $_{23}$V | | 50.9415(1) | | | | | | | |
| $^{40}$V | | 40.0111 | | | | | | | |
| $^{41}$V | | 40.9997 | | | | | | | |
| $^{42}$V | | 41.9912 | <0.055 μs | | | | | | |
| $^{43}$V | | 42.9807 | >0.8 s | $\beta^+$/11.3 | | | | | |
| $^{44}$V | | 43.9744 | 0.09 s | $\beta^+$, α/13.7 | | | | | ann.rad./ |
| $^{45}$V | | 44.96578 | 0.54 s | $\beta^+$/7.13 | | 7/2− | | | |
| $^{46}$V | | 45.960200 | 0.4223 s | $\beta^+$/7.051 | 6.03/100. | 0+ | | | ann.rad./ |
| $^{47}$V | | 46.954907 | 32.6 m | $\beta^+$, EC/2.928 | 1.90/99.+ | 3/2− | | | ann.rad./ 1.7949(8)/0.19 (0.2-2.16) |
| $^{48}$V | | 47.952254 | 15.98 d | $\beta^+$/4.012 | 0.698/50. | 4+ | 2.01 | | ann.rad./ 0.9835/100 (1.3-2.4) |
| $^{49}$V | | 48.948517 | 337. d | EC/0.602 | | 7/2− | 4.47 | | |
| $^{50}$V | 0.250 (4) | 49.947163 | $1.4 \times 10^{17}$ y | EC $\beta^-$ | /82.7 /17.3 | 6+ | +3.34569 | +0.21 | |
| $^{51}$V | 99.750 (4) | 50.943964 | | | | 7/2− | +5.148706 | −0.04 | |
| $^{52}$V | | 51.944780 | 3.76 m | $\beta^-$/3.976 | 2.47/ | 3+ | | | 1.4341(1)/100. |
| $^{53}$V | | 52.944342 | 1.56 m | $\beta^-$/3.436 | 2.52/ | 7/2− | | | 1.0060(5)/90. 1.2891(3)/10. |
| $^{54m}$V | | | 0.9 μs | | | (5+) | | | 0.108/IT |
| $^{54}$V | | 53.94644 | 49.8 s | $\beta^-$/7.04 | 1.00/5. 2.00/12. 2.95/45. 5.20/11. | 3+ | | | 0.8348/97. 0.9887/80. 2.259/46. (0.56-3.38) |
| $^{55}$V | | 54.9472 | 6.5 s | $\beta^-$/6.0 | 6.0/ | (7/2−) | | | 0.5177/73. (0.224-1.21) |
| $^{56}$V | | 55.9504 | 0.23 s | $\beta^-$/9.1 | | | | | 0.70/50. 0.34/40. 1.00/30. |
| $^{57}$V | | 56.9524 | 0.33 s | $\beta^-$/8.1 | | | | | 0.30/60. 0.60/30. 0.80/30. |
| $^{58}$V | | 57.9567 | 0.20 s | $\beta^-$/11.6 | | | | | |
| $^{59}$V | | 58.9593 | 0.13 s | $\beta^-$/9.9 | | | | | 0.90/80. |
| $^{60}$V | | 59.965 | 0.20 s | $\beta^-$/14. | | | | | 0.102-0.208 |
| $^{61}$V | | 60.967 | 0.04 s | | | | | | 0.646 |
| $^{62}$V | | 61.973 | ≈65 ms | | | | | | |
| $^{63}$V | | 62.977 | >0.15 μs | | | | | | |
| $^{64}$V | | | >0.15 μs | | | | | | |
| $_{25}$Mn | | 54.938049(9) | | | | | | | |
| $^{44}$Mn | | 44.0069 | <0.105 μs | | | | | | |
| $^{45}$Mn | | 44.9945 | <0.07 μs | | | | | | |
| $^{46}$Mn | | 45.9867 | 34. ms | $\beta^+$/17.1 $\beta^+$, p | //≈58 | | | | |
| $^{47}$Mn | | 46.9761 | ≈0.1 s | $\beta^+$/12.3 | | | | | |
| $^{48}$Mn | | 47.9689 | 0.15 s | $\beta^+$/13.5 | 5.79/58. 4.43/10 | 4+ | | | |
| $^{49}$Mn | | 48.95962 | 0.38 s | $\beta^+$/7.72 | 6.69/ | 5/2− | | | ann.rad./ |
| $^{50m}$Mn | | | 1.74 m | $\beta^+$/7.887 | 3.54/ | 5+ | | | ann.rad./ 1.0980/94. 0.783/91. (0.66-3.11) |

TABLE 4-continued

| | | | Reference Information | | | | | | |
|---|---|---|---|---|---|---|---|---|---|
| Element | Natural Abundance (Atom %) | Atomic Mass or Weight | Half-life/ Resonance Width (MeV) | Decay Mode/ Energy (/MeV) | Particle Energy/ Intensity (MeV/%) | Spin $(h/2\pi)$ | Nuclear Magnetic Mom. (nm) | Elect. Quadr. Mom. (b) | γ-Energy/ Intensity (MeV/%) |
| $^{50}$Mn | | 49.954244 | 0.283 s | $\beta^+$/7.6330 | 6.61/ | 0+ | | | ann.rad./ |
| $^{51}$Mn | | 50.948215 | 46.2 m | $\beta^+$, EC/3.208 | 2.2/ | 5/2− | 3.568 | 0.4 | ann.rad./ 0.7491(1)/0.26 (1.148-1.164) |
| $^{52m}$Mn | | | 21.1 m | $\beta^+$/98/5.09 I.T./2./0.378 | 2.631 | 2+ | 0.0076 | | ann.rad./ 0.3778 (I.T.) 1.43406(1)/98. (0.7-4.8) |
| $^{52}$Mn | | 51.945570 | 5.591 d | $\beta^+$/4.712 EC/ | 0.575/ | 6+ | +3.063 | +0.5 | ann.rad./ 0.74421(1)/90. 1.4341/100 |
| $^{53}$Mn | | 52.941294 | 3.7 × 10$^6$ y | EC/0.5970 | | 7/2− | 5.024 | | |
| $^{54}$Mn | | 53.940363 | 312.1 d 6.7 × 10$^8$ y | EC/1.377 $\beta^+$ | //1.3 × 10$^{-7}$ | 3+ | +3.282 | +0.33 | 0.8340/100 |
| $^{55}$Mn | 100. | 54.938049 | | | | 5/2− | +3.4687 | +0.32 | |
| $^{56}$Mn | | 55.938909 | 2.579 h | $\beta^-$/3.6954 | 0.718/18. 1.028/34. | 3+ | +3.2266 | | 0.84675/99 1.81072(4)/27. 2.113/14.5 |
| $^{57}$Mn | | 56.938287 | 1.45 m | $\beta^-$/2.691 | | 5/2− | | | |
| $^{58}$Mn | | 57.93999 | 65 s | $\beta^-$/6.25 | 3.8/ 5.1/ | 3+ | | | 0.45916(2)/20. 0.81076(1)/82. 1.32309(5)/53. |
| $^{59}$Mn | | 58.94045 | 4.6 s | $\beta^-$/5.19 | 4.5/ | 5/2− | | | 0.726/ 0.473/ 0.287-2.35 |
| $^{60m}$Mn | | | 1.77 s | $\beta^-$/IT | 5.7/ | 3+ | | | 0.824/ |
| $^{60}$Mn | | 59.9433 | 50. s | $\beta^-$/8.6 | | 0+ | | | 1.969/ |
| $^{61}$Mn | | 60.9446 | 0.67 s | $\beta^-$/7.4 | | (5/2)− | | | |
| $^{62}$Mn | | 61.9480 | 0.67 s | $\beta^-$/10.4 | | (3+) | | | 0.877/ 0.942-1.299 |
| $^{63}$Mn | | 62.9498 | 0.28 s | $\beta^-$/8.8 | | | | | 0.356, 0.450 |
| $^{64m}$Mn | | | >0.1 ms | | | | | | 0.135/IT |
| $^{64}$Mn | | 63.9537 | 87 ms | $\beta^-$/11.8 | | | | | 0.746 |
| $^{65}$Mn | | 64.9561 | 0.09 s | $\beta^-$/10 | | | | | 0.366 |
| $^{66}$Mn | | 65.961 | 66 ms | | | | | | 0.471 |
| $^{67}$Mn | | 66.964 | 42 ms | | | | | | |
| $^{68}$Mn | | | 28 ms | | | | | | |
| $^{69}$Mn | | | 14 ms | | | | | | |
| $_{59}$Pr | | 140.90765(2) | | | | | | | |
| $^{121}$Pr | | 120.955 | 0.6 s | | | | | | |
| $^{122}$Pr | | 121.952 | | | | | | | |
| $^{123}$Pr | | 122.946 | | | | | | | |
| $^{124}$Pr | | 123.943 | 1.2 s | $\beta^+$, EC/12. | | | | | ann.rad./ |
| $^{125}$Pr | | 124.9378 | ≈3.3 s | $\beta^+$ | | | | | ann.rad./ 0.1358 |
| $^{126}$Pr | | 125.9353 | 3.1 s | $\beta^+$, EC/≈10.4 | | | | | ann.rad./ (0.170-0.985) |
| $^{127}$Pr | | 126.9308 | 4.2 s | $\beta^+$/≈7.5 | | | | | ann.rad./ (0.028-0.8949) |
| $^{128}$Pr | | 127.9288 | 3.0 s | $\beta^+$, EC/≈9.3 | | | | | ann.rad./ 0.207/100 0.400-1.373 |
| $^{129}$Pr | | 128.9249 | 32 s | $\beta^+$, EC/5.8 | | | | | ann.rad./ (0.0395-1.865) |
| $^{130}$Pr | | 129.9234 | 40. s | $\beta^+$, EC/8.1 | | | | | ann.rad./ (0.06-0.16) |
| $^{131m}$Pr | | | 5.7 s | | | | | | |
| $^{131}$Pr | | 130.9201 | 1.7 m | $\beta^+$, EC/5.3 | | | | ≈5.5 | ann.rad./ (0.059-0.980) |
| $^{132}$Pr | | 131.9191 | 1.6 m | $\beta^+$, EC/7.1 | | | | | ann.rad./ 0.325 0.496 0.533 |
| $^{133m}$Pr | | | 1.1 s | IT/0.192 | | | | | 0.1305 0.0617 |
| $^{133}$Pr | | 132.9162 | 6.5 m | $\beta^+$, EC/4.3 | | 5/2+ | | | ann.rad./ 0.074 0.1343 0.2419 0.3156 0.3308 0.4650 |

TABLE 4-continued

Reference Information

| Element | Natural Abundance (Atom %) | Atomic Mass or Weight | Half-life/ Resonance Width (MeV) | Decay Mode/ Energy (/MeV) | Particle Energy/ Intensity (MeV/%) | Spin (h/2π) | Nuclear Magnetic Mom. (nm) | Elect. Quadr. Mom. (b) | γ-Energy/ Intensity (MeV/%) |
|---|---|---|---|---|---|---|---|---|---|
| $^{134m}$Pr | | | ≈11 m | β$^+$, EC/ | | | | | ann.rad./ 0.294 0.460 0.495 0.632 |
| $^{134}$Pr | | 133.9157 | 17. m | β$^+$, EC/6.2 | | 2+ | | | ann.rad./ 0.294 0.495 |
| $^{135}$Pr | | 134.9131 | 24. m | β$^+$, EC/3.7 | 2.5/ | 3/2+ | | | ann.rad./ 0.0826 0.2135 0.2961 0.5832 |
| $^{136}$Pr | | 135.91265 | 13.1 m | β$^+$/57/5.13 EC/43 | 2.98/ | 2+ | | | ann.rad./ Ce k x-ray 0.5398 0.5522 |
| $^{137}$Pr | | 136.91068 | 1.28 h | β$^+$/26/2.70 EC/74/ | 1.68/ | 5/2+ | | | ann.rad./ Ce k x-ray 0.4339 0.5140 0.8367 (0.16-1.8) |
| $^{138m}$Pr | | | 2.1 h | β$^+$/24/ EC/76/ | 1.65/ | 7− | | | ann.rad./ Ce k x-ray 0.3027 0.7887 1.0378 (0.07-2.0) |
| $^{138}$Pr | | 137.91075 | 1.45 m | β$^+$/75/4.44 EC/25/ | 3.42/ | 1+ | | | ann.rad./ Ce k x-ray 0.7887 |
| $^{139}$Pr | | 138.90893 | 4.41 h | β$^+$/8/2.129 EC/92/ | 1.09/ | 5/2+ | | | ann.rad./ Ce k x-ray 0.2551 1.3473 1.6307 |
| $^{140}$Pr | | 139.90907 | 3.39 m | β$^+$/51/3.39 EC/49/ | 2.37/ | 1+ | | | ann.rad./ Ce k x-ray 0.3069 1.5965 |
| $^{141}$Pr | 100. | 140.907648 | | | | 5/2+ | +4.275 | −0.08 | |
| $^{142m}$Pr | | | 14.6 m | I.T./0.004 | c.e./ | 5− | 2.2 | | |
| $^{142}$Pr | | 141.910041 | 19.12 h | β$^−$/2.162 EC/0.744 | 0.58/4 2.16/96 | 2− | +0.234 | +0.030 | 0.5088 1.57580 |
| $^{143}$Pr | | 142.910813 | 13.57 d | β$^−$/0.934 | 0.933/ | 7/2+ | +2.70 | +0.8 | 0.7420 |
| $^{144m}$Pr | | | 7.2 m | IT/99+/0.059 β$^−$/ | | 3− | | | Pr k x-ray 0.0590 0.6965 0.8142 |
| $^{144}$Pr | | 143.913301 | 17.28 m | β$^−$/2.998 | 0.807/1 2.30/ 2.996/98 | 0− | | | 0.69649 1.48912 2.18562 |
| $^{145}$Pr | | 144.91451 | 5.98 h | β$^−$/1.81 | 1.80/97 | 7/2+ | | | 0.0725 0.6758 0.7483 |
| $^{146}$Pr | | 145.9176 | 24.2 m | β$^−$/4.2 | 2.2/30 3.7/10 4.2/40 | 2− | | | 0.4539/48 1.5247 |
| $^{147}$Pr | | 146.91898 | 13.4 m | β$^−$/2.69 | 1.5/ 2.1/ | 3/2+ | | | 0.3146/24. 0.5779/16 0.6413/19. |
| $^{148m}$Pr | | | 2.0 m | β$^−$/ | 4.0/ 3.8/ | (4) | | | 0.3016 0.4506 0.6975 |
| $^{148}$Pr | | 147.9222 | 2.27 m | β$^−$/4.9 | 4.8/ 4.5/ | 1− | | | 0.3017 |
| $^{149}$Pr | | 148.92379 | 2.3 m | β$^−$/3.40 | 3.0 | (5/2+) | | | 0.1085 0.1385 0.1651 |
| $^{150}$Pr | | 149.9270 | 6.2 s | β$^−$/5.7 | ≈5.5 | 1− | | | 0.1302 0.8044 0.8527 |

TABLE 4-continued

Reference Information

| Element | Natural Abundance (Atom %) | Atomic Mass or Weight | Half-life/ Resonance Width (MeV) | Decay Mode/ Energy (/MeV) | Particle Energy/ Intensity (MeV/%) | Spin (h/2π) | Nuclear Magnetic Mom. (nm) | Elect. Quadr. Mom. (b) | γ-Energy/ Intensity (MeV/%) |
|---|---|---|---|---|---|---|---|---|---|
| $^{151}$Pr | | 150.9283 | 22.4 s | β−/4.2 | | | | | |
| $^{152}$Pr | | 151.9319 | 3.2 s | β−/6.7 | | 4+ | | | 0.0726 |
| | | | | | | | | | 0.164 |
| | | | | | | | | | 0.285 |
| $^{153}$Pr | | 152.9339 | 4.3 s | β−/5.5 | | | | | |
| $^{154}$Pr | | 153.9381 | 2.3 s | β−/7.9 | | | | | |
| $^{155}$Pr | | 154.9400 | | | | | | | |
| $^{156}$Pr | | 155.944 | | | | | | | |
| $^{157}$Pr | | 156.947 | | | | | | | |
| $^{158}$Pr | | 157.952 | | | | | | | |
| $^{159}$Pr | | 158.955 | | | | | | | |

EXAMPLES

The following examples are given to illustrate various embodiments within the scope of the present invention. These are given by way of example only, and it is to be understood that the following examples are not comprehensive or exhaustive of the many embodiments within the scope of the present invention.

Example 1

Praseodymium Doping—NMSG

A tantalum sheet about 1.5 inches in width and about 8 feet long and about 0.002 inches thick was laid out on a table along with a similar sheet made of aluminum except the aluminum was about 0.001 inches thick. An active mixture of barium titanate and praseodymium oxide was mixed together in molar ratios from 90:10 to 50:50 in increments of 5%. This mixture was blended with mica-based cement called Resbond 907, Coltronics, Inc., NY. The ratio of cement to active powder was in a 50:50 weight percent ratio. Iron powder was also added to certain blends at the expense of the praseodymium oxide up to 0.2 mole percent. Distilled water was added to make a thick slurry paste that was subsequently painted or brushed on the two metal foils. The two foils were then placed on top of the other and rolled up on a 12 inch mandrel. The aluminum foil was connected to the negative electrode and the tantalum foil was connected to the positive electrode. The combined coil was heated to 460° C. in a vacuum and poled using 6,000 volts at a small current of about 1 milliampere.

After the coil was poled, the assembled generator gave a potential 3.5V. To test the current, an LED was placed between the electrodes and lit continuously. The LED required a turn-on voltage of about 2.2 Volts and about 10 milliampere.

Example 2

Manganese Doping—NMSG

A tantalum sheet about 1.5 inches in width and about 8 feet long and about 0.002 inches thick was laid out on a table along with a similar sheet made of aluminum except the aluminum was about 0.001 inches thick. An active mixture of barium titanate and manganese oxide was mixed together in molar ratios from 90:10. This mixture was blended with a cement called Resbond 907, Coltronics, Inc., NY. The ratio of cement to active powder was in a 50:50 weight percent ratio. Iron powder was also added to certain blends at the expense of the manganese oxide at 0.2 mole percent. Distilled water was added to make a thick slurry paste that was subsequently painted or brushed on the two metal foils. The two foils were then placed on top of the other and rolled up on a 12 inch mandrel. The aluminum foil was connected to the negative electrode and the tantalum foil was connected to the positive electrode. The combined coil was heated to 460° C. in a vacuum and poled using 6,000 volts at a small current of about 1 milliampere.

After the coil was poled, the assembled generator gave a potential of about 5 volts. To test the current, an LED was placed between the electrodes and lit continuously. The LED required a turn-on voltage of about 2.2 Volts and about 10 milliampere.

Example 3

Barium Titanate—RPEG

A tantalum sheet about 1.5 inches in width and about 8 feet long and about 0.002 inches thick was laid out on a table along with a similar sheet made of aluminum except the aluminum was about 0.001 inches thick. An active mixture of barium titanate was mixed together in molar ratio of 50:50. This mixture was blended with a cement called Resbond 907, Coltronics, Inc., NY. The ratio of cement to active powder was in a 50:50 weight percent ratio Distilled water was added to make a thick slurry paste that was subsequently painted or brushed on the two metal foils. The two foils were then placed on top of the other and rolled up on a 12 inch mandrel. The aluminum foil was connected to the negative electrode and the tantalum foil was connected to the positive electrode. The combined coil was heated to 460° C. in a vacuum and poled using 6,000 volts at a small current of about 1 milliampere.

After the coil was poled, the assembled generator gave a potential of about 3 volts. To test the current, an LED was placed between the electrodes and lit continuously. The LED required a turn-on voltage of about 2.2 Volts and about 10 milliampere.

Example 4

Praseodymium Doping—NMSG

A tantalum sheet about 1.5 inches in width and about 8 feet long and about 0.002 inches thick was laid out on a table along with a similar sheet made of aluminum except the aluminum was about 0.001 inches thick. An active mixture of barium titanate and praseodymium oxide was mixed together in molar ratios of 90:10. This mixture was blended with a cement called Resbond 907, Coltronics, Inc., NY. The ratio of cement to active powder was in a 50:50 weight percent ratio. Iron powder was also added to certain blends at the expense of the praseodymium oxide at 0.2 mole percent. Distilled water was added to make a thick slurry paste that was subsequently painted or brushed on the two metal foils. The two foils were then placed on top of the other and rolled up on a ½ inch mandrel. The aluminum foil was connected to the negative electrode and the tantalum foil was connected to the positive electrode. The combined coil was heated to 460° C. in a vacuum and poled using 6,000 volts at a small current of about 1 milliampere.

After the coil was poled, the assembled generator gave a potential of about 100 volts. To test the current, an LED was placed between the electrodes and lit continuously. The LED required a turn-on voltage of about 2.2 Volts and about 10 milliampere.

Example 5

Lead Zirconium Titanate Plus Barium Titanate—RPEG

A tantalum sheet about 1.5 inches in width and about 8 feet long and about 0.002 inches thick was laid out on a table along with a similar sheet made of aluminum except the aluminum was about 0.001 inches thick. An active mixture of barium titanate and lead zirconium titanate oxide was mixed together in molar of 50:50. This mixture was blended a cement called Resbond 907, Coltronics, Inc., NY. The ratio of cement to active powder was in a 50:50 weight percent ratio. Distilled water was added to make a thick slurry paste that was subsequently painted or brushed on the two metal foils. The two foils were then placed on top of the other and rolled up on a ½ inch mandrel. The aluminum foil was connected to the negative electrode and the tantalum foil was connected to the positive electrode. The combined coil was heated to 460° C. in a vacuum and poled using 6,000 volts at a small current of about 1 milliampere.

This device produced a potential of 50 Volts which decayed slowly to about 5 volts over a two week period of time. This decay was attributed to the absorption of water which caused a decrease in internal resistance.

Example 6

Sputtered Vanadium—NMSG

Vanadium metal was sputtered in a radio frequency (RF) magnetron vacuum chamber onto a PZT disc obtained from EDO Ceramics, Salt Lake City, Utah. The disc was about 0.020 inches thick and about 1.5 inches in diameter. The disc was coated on one side with silver and the vanadium acted as the other electrode. The disc was placed inside a 0.5 tesla external magnet. Again, the vanadium layered device did not show significant voltage or current, except for the expected capacitive effect.

After the disc was poled the assembled generator gave a negative result in that there was no voltage or current generated. This is attributed to the fact that the vanadium, though it has a high natural abundance of a high nuclear magnetic spin; the nuclear spin was of an "even" configuration. Therefore, it was concluded that only "odd" spin nuclei provided sufficient coulombic interaction with outer electrons causing greater impact on the ferroelectric material.

Example 7

Sputtered Molybdenum—NMSG

Molybdenum metal was sputtered in a radio frequency (RF) magnetron vacuum chamber onto a PZT disc obtained from EDO Ceramics, Salt Lake City, Utah. The disc was about 0.020 inches thick and about 1.5 inches in diameter. The disc was sputtered on one side with silver and the molybdenum acted as the other electrode. The sputtered thickness of silver was about 200 nm and the molybdenum thickness was about 800 nm. The disc was placed inside a 0.5 tesla external magnet. The potential obtained on the molybdenum layered device was about 0.5 Volts and the current was measured in the 3 to 6 microampere. The current and voltage remained constant for about 6 months. This device was sectioned to analyze the electrode PZT interface for precipitates or diffusion of component. No abnormalities were noted at the interface.

Example 8

Magnesium Doped with Deuterium—NMSG

An 800 nm thick magnesium metal layer was sputtered in a (RF) magnetron vacuum chamber onto a PZT disc obtained from EDO Ceramics, Salt Lake City, Utah. The disc was about 0.020 inches thick and about 1.5 inches in diameter. The disc was coated on the other with a 200 nm thick layer of silver. The silver and the magnesium acted as the electrodes. The coated disc was placed in a RF magnetron sputter chamber where deuterium was reactively sputtered into the magnesium layer. About 7% of the magnesium reacted to form a deuterated compound with the magnesium. The disc was placed inside a 0.5 tesla external magnet. The potential obtained on the deuterium doped molybdenum was about 1 Volt and the current was measured at 6 microampere.

Example 9

RPEG

In this case, an ultracapacitor, sometimes termed a pseudocapacitor, was disassembled to remove the component parts to be used in making a remnant polarization electrical generator. Several of these were made using disassembled 20 to 50 Farad capacitors. The active electrolyte material was removed and replaced with poly-vinylidene fluoride. This polymer was dissolved with tetrahydrofuran in a ratio of 20/80 by volume respectively. Two electrode layers, made of ruthenium oxide, were dipped in the solution. The solution was air dried on these two electrode layers at 60° C. The coated layers were fabricated into a device by rolling up and heated to 170° C. for 2 hours where the poly-vinylidene fluoride melted. On cooling the two electrode layers were electrically isolated with about a 2 mega-ohm internal resistance from each other. In this particular case a crystallization and self polarizing process occurred wherein charged functional groups organized into positive and negative regions much like the effect one would see on electrical poling. The device spontaneously self charged and current and voltage could be measured by appropriate connections to the electrodes. The measured performance of the device showed 0.354 volts and produced a current of 2 milliampere. The electrodes of this device were shorted several times and for long lengths of time, up to 2 weeks, and in all cases the device spontaneously and continuously recharged to the values indicated above. No degradation of charge-up or discharge times was ever noticed.

Based upon the results of the foregoing small-scale experiments, other devices utilizing multilayered or rolled configurations may be fabricated that produce substantially higher electric currents and voltages. It will be appreciated that electric generators within the scope of the present invention may be used to provide constant electric current sufficient to "trickle charge" batteries and capacitors which power a wide variety of electronic devices, such as cell phones, PDAs, notebook computers, GPS devices, portable music players, flashlights, remote control devices, radios and communication devices, and so forth. Other electric generators may provide power for discrete circuit board chips and medical applications, such as medical implants for pacemakers and electrical stimulation for pain management.

Electric generators within the scope of the present invention may be fabricated at a sufficient scale to provide stand-alone electric power generation for remote locations, homes, businesses, automobiles, boats, and so forth. Military applications may include electric generators for satellites, space probes, and field applications.

It is believed that the disclosure set forth above encompasses multiple distinct inventions with independent utility. While each of these inventions has been disclosed in its preferred form, the specific embodiments thereof as disclosed and illustrated herein are not to be considered in a limiting sense as numerous variations are possible. The subject matter of the inventions includes all novel and non-obvious combinations and subcombinations of the various elements, features, functions and/or properties disclosed herein. Where the disclosure, the presently filed claims, or subsequently filed claims recite "a" or "a first" element or the equivalent thereof, it should be within the scope of the present inventions that such disclosure or claims may be understood to include incorporation of one or more such elements, neither requiring nor excluding two or more such elements.

Applicants submit claims herewith and reserve the right to submit claims directed to certain combinations and subcombinations that are directed to one of the disclosed inventions and are believed to be novel and non-obvious. Inventions embodied in other combinations and subcombinations of features, functions, elements and/or properties may be claimed through amendment of those claims or presentation of new claims in that or a related application. Such amended or new claims, whether they are directed to a different invention or directed to the same invention, whether different, broader, narrower or equal in scope to the original claims, are also regarded as included within the subject matter of the inventions of the present disclosure.

The present invention may be embodied in other specific forms without departing from its structures, methods, or other essential characteristics as broadly described herein and claimed hereinafter. The described embodiments are to be considered in all respects only as illustrative, and not restrictive. The scope of the invention is, therefore, indicated by the appended claims, rather than by the foregoing description. All changes that come within the meaning and range of equivalency of the claims are to be embraced within their scope.

The invention claimed is:

1. An electric generator comprising:
    a poled ferroelectric crystalline material having a remnant polarization that is due to the alignment of dipoles within the poled ferroelectric crystalline material, the aligned dipoles collectively defining a net electrical dipole moment within the poled ferroelectric crystalline material, the net electrical dipole moment imposing a nontrivial charge differential across opposite sides of the poled ferroelectric crystalline material, where the presence of the nontrivial charge differential is due in substantial part to the net electrical dipole moment rather than to any source external to the poled ferroelectric crystalline material, and a coercive force of the poled ferroelectric crystalline material is sufficiently large to prevent a substantial change of the alignment of the dipoles during operation of the electric generator; and
    a pair of electrical contacts disposed on the opposite sides of the poled ferroelectric crystalline material,
    wherein one electrical contact is a high work function material and the other electrical contact is a low work function material.

2. The electric generator according to claim 1, wherein the high work function material is selected from tantalum, gold, platinum, silver, and aluminum.

3. The electric generator according to claim 1, wherein the low work function material is selected from alkali metals and rare earth metals.

4. The electric generator according to claim 1 wherein the poled ferroelectric crystalline material is selected from the group consisting of poled barium titanate, poled bismuth iron oxide, poled lead titanate, poled strontium bismuth niobate, poled lead zirconium titanate, and mixtures thereof.

5. The electric generator according to claim 1, wherein one electrical contact exhibits a p-type behavior.

6. The electric generator according to claim 1, wherein one electrical contact exhibits an n-type behavior.

7. The electric generator according to claim 1, wherein the poled ferroelectric crystalline material is a displacive type ferroelectric material.

8. The electric generator according to claim 1, wherein the poled ferroelectric crystalline material is an order-disorder ferroelectric material.

* * * * *